(12) United States Patent
Kai et al.

(10) Patent No.: US 6,785,306 B2
(45) Date of Patent: Aug. 31, 2004

(54) WAVELENGTH-TUNABLE STABILIZER LASER

(75) Inventors: Yutaka Kai, Kawasaki (JP); Hideyuki Miyata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 231 days.

(21) Appl. No.: 09/739,218

(22) Filed: Dec. 19, 2000

(65) Prior Publication Data

US 2001/0019562 A1 Sep. 6, 2001

(30) Foreign Application Priority Data

Mar. 6, 2000 (JP) ........................................ 2000-061201

(51) Int. Cl.$^7$ ................................................ H01S 3/10
(52) U.S. Cl. ...................... 372/20; 372/29.03; 359/110
(58) Field of Search ................. 372/20, 29.02, 372/32.33; 359/110, 124, 34.1; 358/24

(56) References Cited

U.S. PATENT DOCUMENTS

| | | | | |
|---|---|---|---|---|
| 5,144,632 | A | * | 9/1992 | Thonn .......................... 372/33 |
| 5,696,859 | A | * | 12/1997 | Onaka et al. .................. 385/24 |
| 6,031,644 | A | * | 2/2000 | Utsumi ........................ 359/110 |
| 6,233,091 | B1 | * | 5/2001 | Kosaka et al. ............... 359/341 |
| 6,262,835 | B1 | * | 7/2001 | Kosaka et al. ............... 359/341 |
| 6,295,147 | B1 | * | 9/2001 | Yamane et al. ............. 359/124 |
| 6,349,103 | B1 | * | 2/2002 | Chung et al. ................. 372/32 |
| 6,389,046 | B1 | * | 5/2002 | Stayt et al. ............... 372/29.02 |
| 6,411,634 | B1 | * | 6/2002 | Zhang et al. ................. 372/32 |

OTHER PUBLICATIONS

Patent Abstracts of Japan of JP 10–285113 dated Oct. 23, 1998.
Patent Abstracts of Japan of JP 07–235719 dated Sep. 5, 1995.
Patent Abstracts of Japan of JP 11–202151 dated Jul. 30, 1999.

* cited by examiner

*Primary Examiner*—Hoanganh Le
*Assistant Examiner*—Jimmy T. Vu
(74) *Attorney, Agent, or Firm*—Staas & Halsey LLP

(57) ABSTRACT

A wavelength-tunable stabilized laser is provided with a light source comprising a plurality of lasers capable of oscillating at a plurality of wavelengths, a light detecting part for detecting the light intensity of laser light output from the light source via a periodic filter, and a controlling part for generating oscillation of one of the lasers of the light source and controlling the oscillation wavelength of the laser so that the output value of the light detecting part becomes equal to a predetermined one of a plurality of target values. The wavelength-tunable stabilized laser is able to generate oscillation of laser light at a desired wavelength, of the plurality of wavelengths, and to stabilize the wavelength.

18 Claims, 24 Drawing Sheets

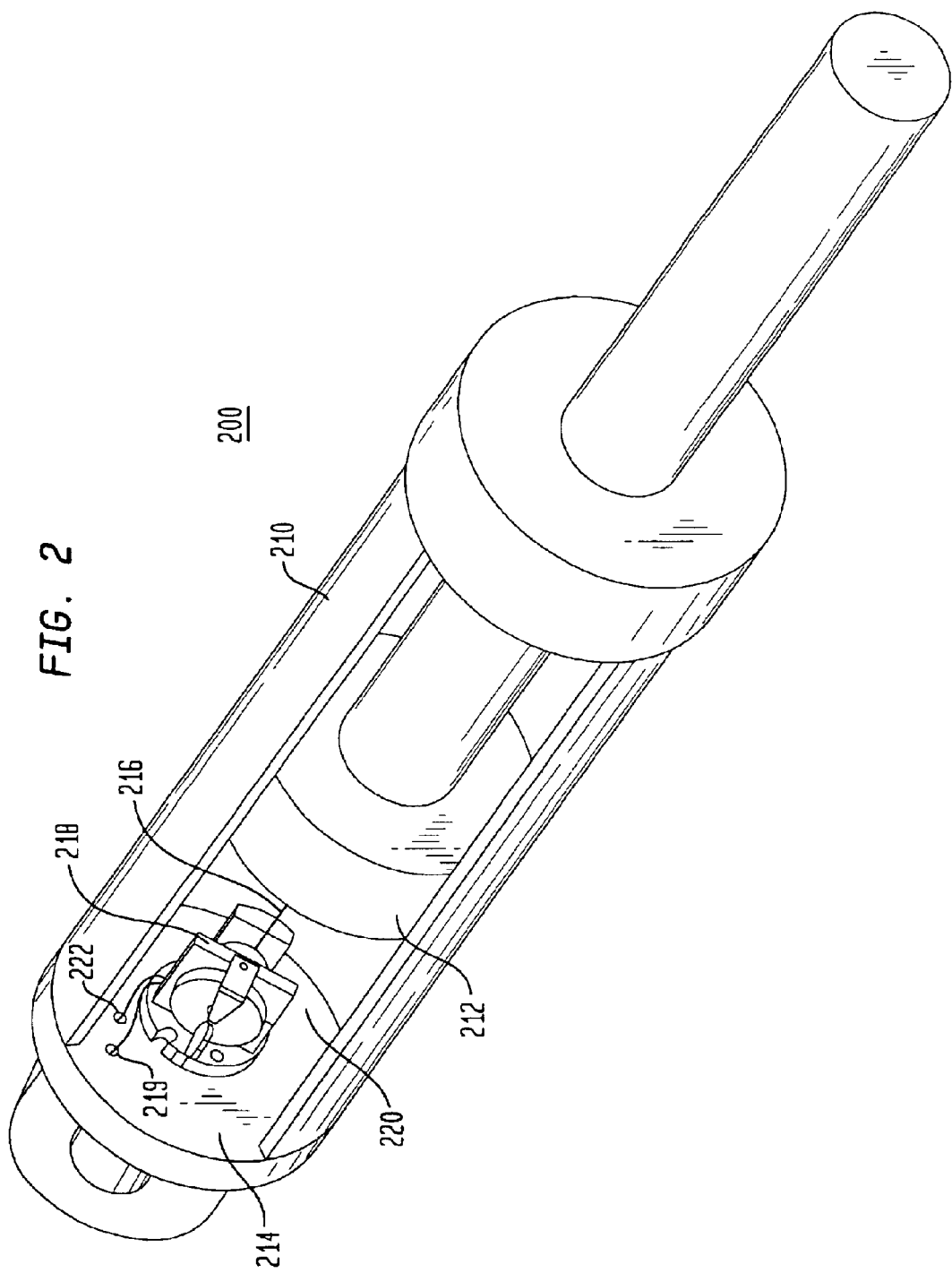

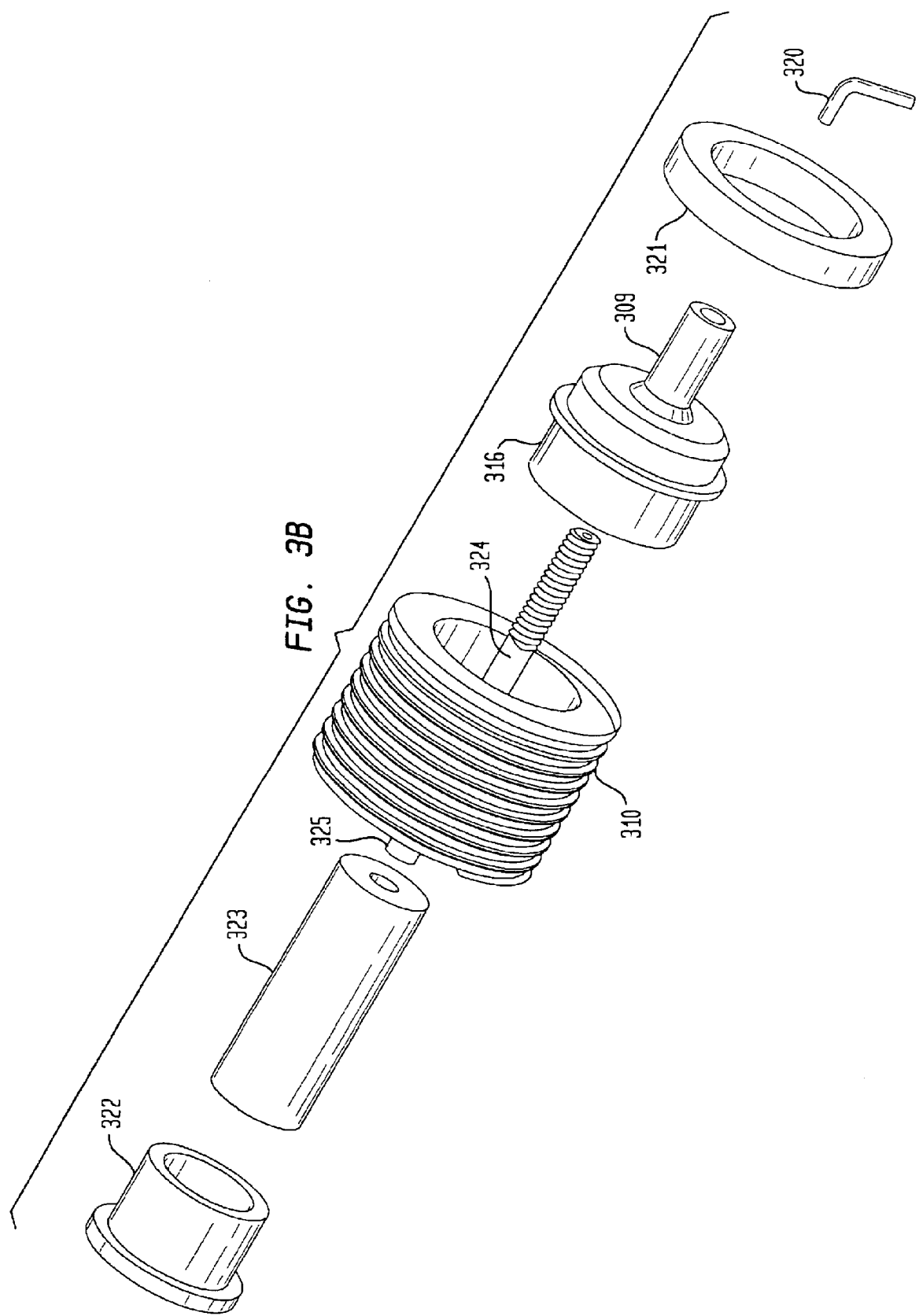

FIG. 21
Related Art
A.
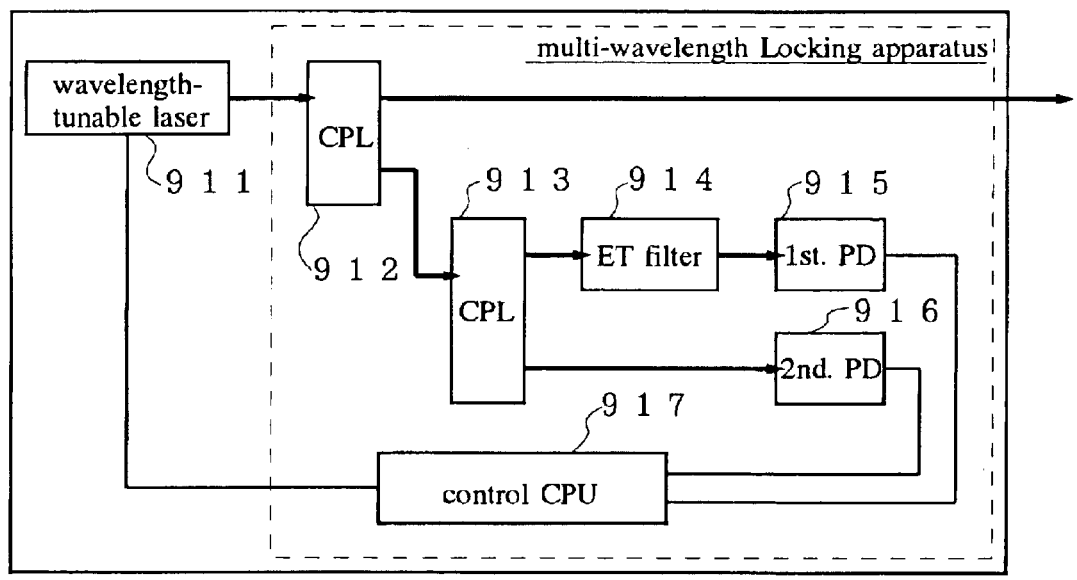
B.
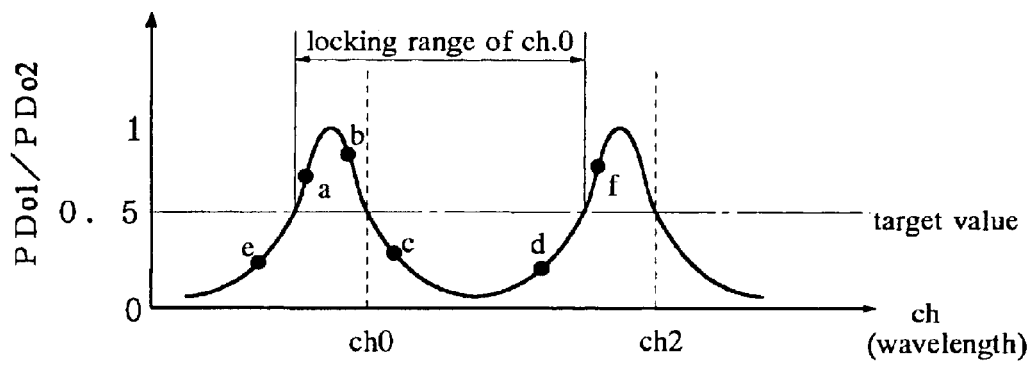
C.
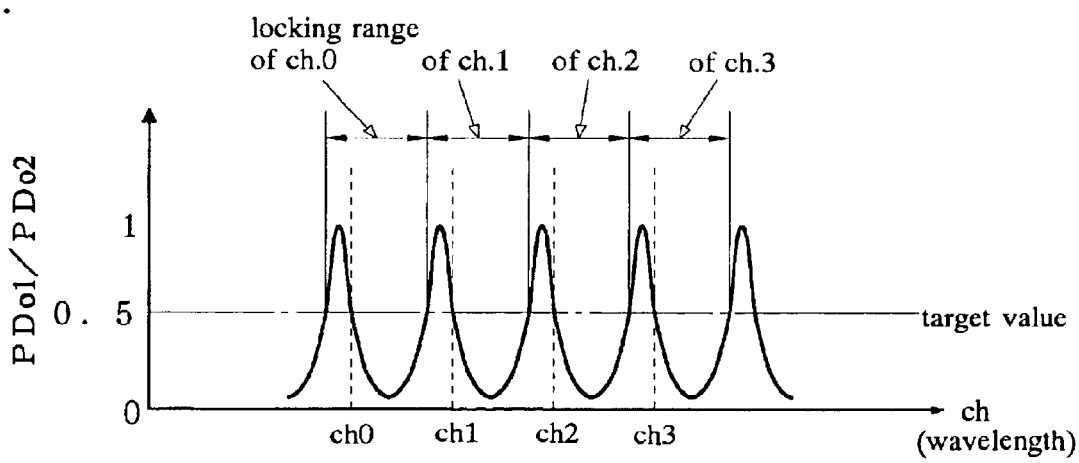

WAVELENGTH-TUNABLE STABILIZER LASER

BACKGROUND OF THE INVENTION

1. Field of the Invention

The present invention relates to a wavelength-tunable stabilized laser which can vary the wavelength of emitted laser light and which, in particular, can almost lock the wavelength of emitted laser light at a desired wavelength.

To construct multimedia networks in the future, ultralong distance, large-capacity optical communication apparatuses are now demanded. To realize such large capacity, wavelength division multiplexing (WDM) optical communication apparatuses are studied and developed because of their advantages such as capability of effectively utilizing the wide bandwidth and large capacity of the optical fiber.

In particular, WDM light source for WDM optical communication is required to output laser light at a plurality of wavelengths. Further, the wavelength spacing need to satisfy a standard, for example, the grid spacing defined for respective channels according to the ITU-T recommendation. WDM light source is studied and developed so as to satisfy such a requirement.

2. Description of the Related Art

Conventionally, in the case of WDM optical communication systems that perform communication by using a four-wave WDM optical signal, a WDM light source is provided with four semiconductor lasers that emit laser beams having different wavelengths or a single wavelength-tunable laser capable of varying the oscillation wavelength by changing the device temperature or the driving current. For example, the multiple quantumwell (MQW) DFB laser, the wavelength-tunable distributed Bragg reflection (DBR) laser, or the like is used as the wavelength-tunable laser.

In particular, the use of a wavelength-tunable laser provides an advantage that the number of semiconductor lasers used as regular-use light sources and reserve light sources are reduced in a WDM light source. For example, in a 32-wave WDM optical communication system, 32 semiconductor lasers are necessary as each of regular-use light sources and reserve light sources if one semiconductor laser is used for one wavelength. In contrast, where wavelength-tunable lasers each capable of emitting laser beams of four wavelengths are used, it is sufficient to use eight semiconductor lasers as each of regular-use light sources and reserve light sources (maximum case).

On the other hand, although in semiconductor lasers the diffraction grating pitch etc. are so designed that single-mode laser light having a predetermined wavelength is emitted in a steady state, oscillation at the predetermined wavelength does not necessary occur at the time of ignition. Even in a steady state, the oscillation wavelength is not always locked at the predetermined wavelength owing to fluctuations. In the case of wavelength-tunable lasers, which are also associated with the above phenomena, the oscillation wavelength needs to be locked at a targeted predetermined wavelength because they can oscillate at multiple wavelengths.

To lock the oscillation wavelength at a desired wavelength, a wavelength locking apparatus is used in WDM light sources.

Referring to FIG. 21A, laser light output from a wavelength-tunable laser 911 is input to a coupler (CPL) 912 that is provided in a multi-wavelength locking apparatus 905 and serves to branch input light into two parts. One branched laser light is output as output light of a WDM light source. The wavelength-tunable laser 911 is an MQW semiconductor laser and has, for example, a characteristic that the oscillation wavelength varies by 0.8 nm when the device temperature is changed by about 8° C.–10° C. Where a WDM optical signal contains four optical signals at wavelength spacing of 0.8 nm according to the ITU-T recommendation, the wavelength-tunable laser 911 can output laser beams of four wavelengths in a temperature range of about 30° C. and emits laser light having one of the four wavelengths by controlling the device temperature.

In the multi-wavelength locking apparatus 905, the other laser light that has branched off at the coupler 912 is input to a coupler 913 for branching input light into two parts. One laser light that has branched off at the coupler 913 is input, via a Fabry-Pérot etalon filter (ET filter) 914, to a first photodiode (PD) 915 for outputting a current in accordance with light intensity. The light intensity of the laser light is detected by the first photodiode 915. The output value of the first PD 915 is represented by PDo1. The other laser light that has branched off at the coupler 913 is input to a second PD 916, where its light intensity is detected. The output value of the second PD 916 is represented by PDo2.

In the ET filter 914, wavelengths having extremum transmittance values are so set that the PDo1 value as normalized by the PDo2 value at an intended locking wavelength, that is, PDo1/PDo2, becomes a target value 0.5.

A control CPU 917 receives PDo1 and PDo2. The control CPU 917 generates a control signal to be used for locking the oscillation wavelength of the wavelength-tunable laser 911 based on these detection values and sends it to the wavelength-tunable laser 911.

The WDM light source having the above configuration operates in the following manner and thereby locks the oscillation wavelength of the wavelength-tunable laser 911 at a ch0 wavelength, for example.

After igniting the wavelength-tunable laser 911, the control CPU 917 receives PDo1 and PDo2 and calculates PDo1/PDo2 (see FIGS. 21A and 21B). When PDo1/PDo2 is greater than the target value 0.5, the control CPU 911 controls the wavelength-tunable laser 911 so that the oscillation wavelength becomes longer by adjusting its device temperature. On the other hand, when PDo1/PDo2 at the time of the ignition is smaller than the target value 0.5, the control CPU 917 controls the wavelength-tunable laser 911 so that the oscillation wavelength becomes shorter. The wavelength-tunable laser 911 is controlled in this manner so that PDo1/PDo2 is always kept at 0.5 and its oscillation wavelength is thereby locked at the ch0 wavelength.

Where the control CPU 917 controls the oscillation wavelength merely by performing the magnitude comparison between PDo1/PDo2 and the target value 0.5, the oscillation wavelength can be locked at the desired ch0 wavelength when the wavelength-tunable laser 911 has ignited at a wavelength of any of points a–d in FIG. 21B. However, when the wavelength-tunable laser 911 has ignited at a wavelength of point e or f, the oscillation wavelength is locked at a wavelength other than the ch0 wavelength.

In view of the above, the control CPU 917 also controls the device temperature at the time of ignition in consideration of a range including the oscillation wavelength at the time of ignition of the wavelength-tunable laser 911.

As described above, in the WDM light source, the oscillation wavelength can be locked at any of ch1, ch2, and ch3 wavelengths in the same manner as at the ch0 wavelength by taking the device temperature at the time of ignition into consideration.

For a wavelength at the time of laser ignition, a wavelength range where a wavelength locking apparatus can lock the laser oscillation wavelength at a desired wavelength is referred to as "locking range."

The locking range width is determined by the FSR (free spectral range) of the ET filter 914 because PDo1/PDo2 has the same value as the wavelength shifts by the FSR as shown in FIG. 21C. Therefore, to equalize the oscillation wavelengths to the wavelengths of optical signals of a WDM optical signal, the FSR of the ET filter 914 is set equal to the wavelength spacing of the WDM optical signal.

On the other hand, the transmittance-wavelength characteristic of the ET filter 914 depends on the temperature. As seen from FIG. 22, as the temperature increases, the transmittance-wavelength characteristic shifts to the longer wavelength side in parallel with the horizontal axis at a rate of about 0.095 nm/°C. In FIG. 22, the vertical axis represents the current value in $\mu A$ (corresponding to the transmittance) of a detector and the horizontal axis represents the wavelength in nm.

The ET filter was made of quartz glass, the mirror surface reflectance was 25%, and the measurement temperature was 22.1° C., 30.0° C., 37.9° C., and 45.7° C.

Because of rapid increase of the communication capacity, it is now required to increase the multiplexing number of a WDM optical signal. To this end, WDM light sources are required to be able to oscillate at many wavelengths such as 32 or 64 wavelengths. On the other hand, since the variable range of the device temperature of wavelength-tunable lasers is limited, WDM light sources need to incorporate a plurality of wavelength-tunable lasers.

In the above circumstances, multi-wavelength locking apparatuses need to attain locking at a desired wavelength for all wavelengths at which oscillation is possible. However, since the transmittance-wavelength characteristic of the EF filter in the apparatus depends on the temperature, the conventional configuration cannot attain locking at all wavelengths.

In particular, locking all wavelengths is more difficult when a wavelength-tunable laser in which the oscillation wavelength is changed by a temperature control, is integrated with an ET filter.

Assume a case where an 8-wave WDM light source is composed of a wavelength-tunable laser capable of oscillating at 0ch to 3ch wavelengths and a wavelength-tunable laser capable of oscillating at 4ch to 7ch wavelengths and an ET filter is made of quartz glass. The each pair of 0ch and 4ch, 1ch and 5ch, 2ch and 6ch, and 3ch and 7ch are controlled at the same device temperature. The transmittance-wavelength characteristic of the ET filter has temperature dependence that the curve shifts by about 0.01 nm for a temperature variation of 1° C. When the wavelength spacing of a WDM optical signal is set at 0.8 nm, the device temperature needs to be changed by 10° C. for each channel, in which case the transmittance-wavelength characteristic of the ET filter shifts by 0.1 nm.

In this case, in the multi-wavelength locking apparatus, the device temperature is set at the same temperature for 0ch and 4ch, for example, so that the FSR of the ET filter needs to be set at 0.8 nm as described above to lock laser beams at the 0ch and 4ch wavelengths. On the other hand, to lock laser beams at the 0ch to 3ch wavelengths, the FSR of the ET filter needs to be set at 0.7 (=0.8−0.1) nm in view of the shift of the ET filter.

That is, in the multi-wavelength locking apparatus, the FSR of the ET filter needs to be set at 0.8 nm on one hand and needs to be set at 0.7 nm on the other hand. It is difficult to satisfy both requirements as long as the conventional configuration is employed.

In addition, when it is attempted to increase the transmission rate from 2.5 Gbps to 10 Gbps to increase the communication capacity in the conventional configuration, increased modulation rate causes a spectrum line width problem and a relative intensity noise problem.

SUMMARY OF THE INVENTION

An object of the invention is to provide a wavelength-tunable stabilized laser capable of changing and stabilizing the wavelength of laser light.

The above object is attained by a wavelength-tunable stabilized laser comprising: a light source comprising a plurality of lasers capable of oscillating at a plurality of wavelengths; a light detecting part for detecting the light intensity of laser light output from the light source via a periodic filter; and a controlling part for generating oscillation of one of the lasers of the light source and controlling the oscillation wavelength of the laser so that an output value of the light detecting part becomes equal to a predetermined one of a plurality of target values.

In the invention, a plurality of target values is respectively set for each of wavelengths at which oscillation is possible. This makes it possible to generate oscillation of laser light at a desired wavelength among the plurality of wavelengths and stabilize the laser light at the desired wavelength. Further, integrating wavelength-tunable lasers and a wavelength detecting part realizes reduction in size and cost of the wavelength-tunable stabilized laser according to the invention.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 2 shows the configuration of a wavelength-tunable stabilized laser according to a second embodiment of the invention;

FIG. 17 to FIGS. 20A–20B show wavelength-tunable stabilized laser modules of first to fourth examples, respectively;

FIG. 21A shows the configuration of a conventional WDM light source;

FIG. 21B illustrates how the oscillation wavelength is locked at a ch0 wavelength;

FIG. 21C shows a relationship between channel wavelengths and their respective locking ranges in a conventional multi-wavelength locking apparatus.

DESCRIPTION OF THE PREFERRED EMBODIMENTS

Figure 1:
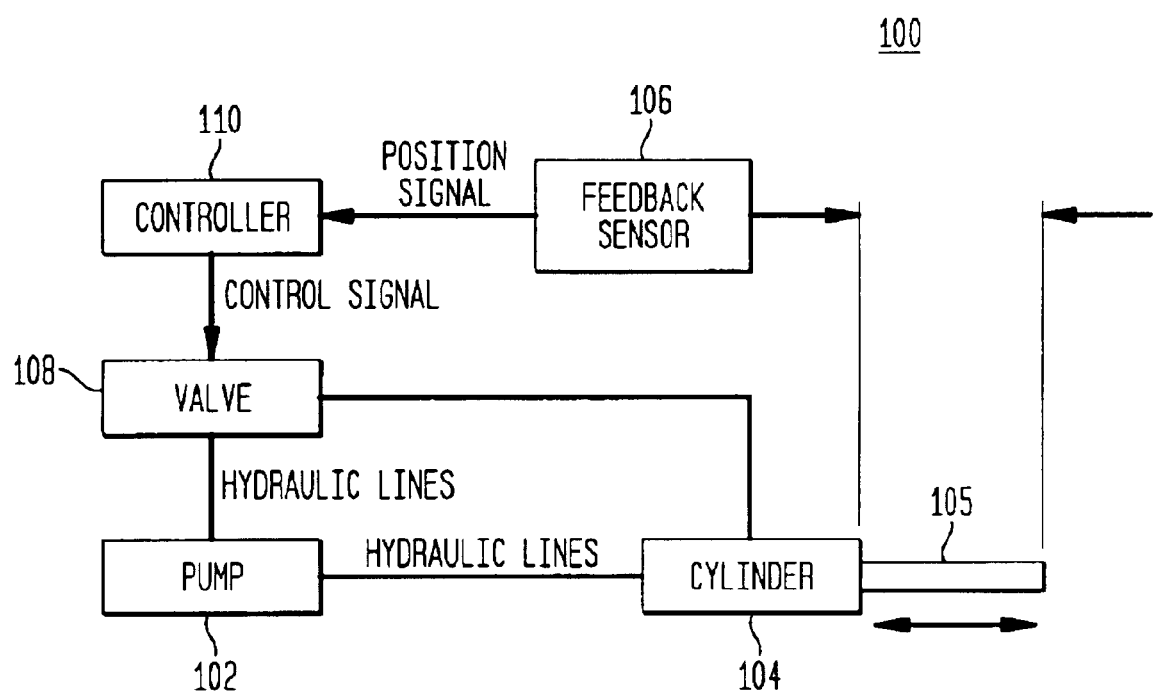
FIG. 1 shows the configuration of a wavelength-tunable stabilized laser according to a first embodiment of the invention.

Embodiments according to the present invention will be hereinafter described with reference to the accompanying drawings. The same components are given the same reference symbols in the drawings and redundant descriptions may be omitted.

Embodiment 1

(Configuration)

A first embodiment is directed to a wavelength-tunable stabilized laser.

As shown in FIG. 1, a wavelength-tunable stabilized laser is basically composed of a light source 11, a periodic filter 12, a light detecting part 13, and a controlling part 14.

The light source 11 is provided with a plurality of lasers each capable of oscillating at a plurality of wavelengths. Laser light output from the light source 11 is input to the periodic filter 12 having a periodic transmittance-wavelength characteristic. Laser light output from the periodic filter 12 is input to the light detecting part 13, which detects the light intensity of the received laser light and converts it into an electrical signal corresponding to the light intensity. The light detecting part 13 supplies the electrical signal to the controlling part 14. The controlling part 14 generates oscillation of one of the lasers of the light source 11 at a desired wavelength. The controlling part 14 controls the oscillation wavelength of an oscillating laser so that the output value of the light detecting part 13 becomes equal to a target value corresponding to a desired wavelength among a plurality of target values that are set for the respective wavelengths.

(Principle of operation and advantages)

In the above-configured wavelength-tunable stabilized laser, a plurality of target values are set in advance for the respective wavelengths at which oscillation is possible. The controlling part 14 controls an oscillating laser of the light source 11 so that the output value of the light detecting part 13 becomes equal to a target value corresponding to the oscillation wavelength. Since as described above the target values are set for the respective wavelengths and the lasers are controlled so as to attain the target values, it is possible to compensate for the temperature dependence in the transmittance-wavelength characteristic of the periodic filter 12.

Therefore, the wavelength-tunable stabilized laser can emit desired laser light that is stabilized in wavelength irrespective of a temperature variation and a wavelength change.

(Preferable configurations)

In particular, where laser beams output from the light source 11 have an approximately constant wavelength spacing, it is preferable that the period of the periodic filter be set equal to the approximately constant wavelength spacing and that each of the target values of the controlling part 14 be set between two adjacent extremums in the transmittance-wavelength characteristic of the periodic filter 12.

In this case, the target value of a wavelength can be equalized to the target value of another wavelength. Setting each of the target values between two adjacent extremums in the transmittance-wavelength characteristic of the periodic filter 12 makes it possible to reliably stabilize the oscillation wavelength.

In this specification, a characteristic curve between adjacent extremums in a transmittance-wavelength characteristic may be referred to as a "shoulder of the transmittance-wavelength characteristic." A characteristic curve extending in the wavelength increasing direction from a local maximum to a local minimum that are adjacent to each other may be referred to as a "right shoulder of the transmittance-wavelength characteristic." A characteristic curve extending in the wavelength increasing direction from a local minimum to a local maximum that are adjacent to each other may be referred to as a "left shoulder of the transmittance-wavelength characteristic."

It is preferable that a target value corresponding to the center wavelength of a plurality of oscillation wavelengths of each laser of the light source 11 be set approximately at the center of two adjacent extremums in the transmittance-wavelength characteristic. For example, where six semiconductor lasers are provided in the light source 11 and each semiconductor laser can oscillate at five wavelengths having spacing of 0.8 nm, a target value corresponding to the third wavelength is set approximately at the center of a shoulder of the transmittance-wavelength characteristic.

Since a target value corresponding to the center wavelength is set approximately at the center of a shoulder of the transmittance-wavelength characteristic, target values corresponding to other wavelengths are also located properly on shoulders of the transmittance-wavelength characteristic. Therefore, in the wavelength-tunable stabilized laser, the wavelengths of output laser beams can be stabilized in approximately the same degree of accuracy.

In this specification, the term "center wavelength" signifies the center of a wavelength band in which a single laser can oscillate.

It is preferable that the controlling part 14 controls the oscillation wavelength after generating oscillation of one of the lasers provided in the light source 11 to oscillate at a wavelength which is in a range including a wavelength approximately at the center of two adjacent extremums of the transmittance-wavelength characteristic. The range is included in ranges between a desired wavelength and a wavelength closest to the desired wavelength and having an extremum of the transmittance-wavelength characteristic.

It is also preferable that the controlling part 14 controls the oscillation wavelength after generating oscillation of one of the lasers provided in the light source 11 at a wavelength which is closest to the desired wavelength and is approximately at the center of two adjacent extremums of the transmittance-wavelength characteristic.

Even when as described above a target value corresponding to the center wavelength is located approximately at the center of a shoulder of the transmittance-wavelength characteristic, target values corresponding to wavelengths that are distant from the center wavelength are located close to an extremum on the characteristic curve. That is, although the target value corresponding to the center wavelength is located at the center of a locking range, target values corresponding to wavelengths that are distant from the center wavelength deviate from the center of a locking range so as to be located on its longer or shorter wavelength side. Therefore, for example, where a target value is located on the longer wavelength side of the center of a locking range, the portion of the locking range on the shorter wavelength side of the target value is wider than the portion on the longer wavelength side. When the laser is ignited in the narrower, longer-wavelength-side portion, it is difficult for the controlling part 14 to perform a wavelength stabilizing control.

The controlling part 14 can reliably stabilize the oscillation wavelength at a desired wavelength by igniting the laser at a wavelength that is in a range including a wavelength approximately at the center of a shoulder of the transmittance-wavelength characteristic or a wavelength approximately at the center of a shoulder of the transmittance-wavelength characteristic.

It is preferable that the wavelength-tunable stabilized laser further has an optical amplifying part (O-Amp) 21 for amplifying laser light to be output from the wavelength-tunable stabilized laser.

In the above wavelength-tunable stabilized laser, the light source 11, the periodic filter 12, the light detecting part 13, and the controlling part 14 constitute a feedback control system for wavelength control. Therefore, to output controlled laser light, a coupler 22 for branching light into two parts may be provided between the light source 11 and the periodic filter 12 as indicated by a broken line in FIG. 1.

Therefore, the O-Amp 21 for amplifying laser light to be output may be connected between the light source 11 and the coupler 22 or with the coupler 22 and a port for outputting laser light of the coupler 22 to the exterior as indicated by a broken line in FIG. 1.

When provided with the O-Amp 21, the wavelength-tunable stabilized laser can compensate for insufficiency in the light intensity of output laser light.

Further, when provided with an isolator (ISO) 23 between the coupler 22 and the O-Amp 21-2 as indicated by a broken line in FIG. 1, the wavelength-tunable stabilized laser can prevent a kink that would otherwise occur in the semiconductor lasers of the light source 11. This is because a kink is caused by re-entrance into a semiconductor laser of reflection light that occurs in a connecting portion or a junction portion between optical components such as the coupler 22, the O-AMP 21, and the periodic filter 12. A kink is observed as a spike-like twist in the optical output-driving current characteristic of a semiconductor laser.

A semiconductor laser optical amplifier or an optical fiber amplifier can be used as the O-Amp 21.

It is preferable that the O-Amp 21 be used in the saturation range.

Where the driving current of a laser in the light source 11 is controlled to control the wavelength of output laser light of the laser, a variation occurs in the light intensity of the laser light. When the wavelength-tunable stabilized laser is used in the saturation range, the light intensity of laser light that is output from the O-Amp 21 can be kept approximately constant. Therefore, laser light having stable light intensity can be output.

It is preferable that the controlling part 14 control the oscillation wavelength by controlling the device temperature of one of the lasers provided in the light source 11. It is also preferable that the controlling part 14 control the oscillation wavelength by controlling the driving current of one laser. It is preferable that the controlling part 14 control the device temperature in generating oscillation of one laser and control the driving current in controlling the oscillation wavelength.

Where the lasers provided in the light source 11 are semiconductor lasers, the oscillation wavelength can be changed by controlling their device temperature or driving current. In particular, in the case of the MQW semiconductor laser, larger output power and higher reliability can be obtained by controlling the oscillation wavelength by controlling the device temperature.

The controlling part 14 when generating oscillation at one of a plurality of wavelength at which oscillation is possible, controls the device temperature and when finely adjusting (stabilizing) the oscillation wavelength to attain a target value, controls the driving current. This realizes prompt stabilization of a desired wavelength compared to controlling only the device temperature since control of the driving current has a smaller time constant than control of the device temperature.

It is preferable that the periodic filter 12 is of a plurality of filters whose transmittance-wavelength characteristics are the same in period (FSR: free spectrum range) and temperature dependence. In this case, it is at least necessary that the number of the light detecting parts 13 corresponds with the number of filters. It is even preferable that laser beams output from the light source 11 have approximately constant wavelength spacing, each of the spacing is divided into a plurality of wavelength ranges, and each of the ranges is respectively within ranges between two adjacent extremums of the transmittance-wavelength characteristics of the filters.

By using a plurality of filters in this manner, proper filters can be assigned in accordance with respective target values and hence each target value can be located approximately at the center of a shoulder of the transmittance-wavelength characteristic. Therefore, the wavelength-tunable stabilized laser can emit, more reliably, laser light that is stabilized at a desired wavelength. Even when a periodic filter is designed so as to have a desired FSR, periodic filter products whose FSRs deviate from the desired value are manufactured in reality. However, the above configuration enables use of periodic filter products whose FSRs deviate from the design value. The yield of periodic filter products can thus be increased.

It is preferable that the periodic filter 12 be a filter which has temperature dependence, which is transmittance-wavelength characteristic, in accordance with temperature dependence of the oscillation wavelength of the lasers.

A wavelength-tunable stabilized laser may be provided which is configured in such a manner that the light source 11 is a laser capable of oscillating at a plurality of wavelengths and that the periodic filter 12 receives laser light output from the laser and its temperature dependence is in accordance with the temperature dependence of the oscillation wavelength of the laser.

In the wavelength-tunable stabilized laser having the above configuration, since the temperature dependence is adjusted in accordance with that of the oscillation wavelength of the laser, the target values of the controlling part 14 corresponding to the respective channels can be equalized. This makes it possible to output with more reliability laser light that is stabilized at a desired wavelength.

For example, the temperature dependence is made the same as that of the oscillation wavelength of the laser. That is, where the laser has an oscillation wavelength variation $\Delta L$ for a temperature variation $\Delta T$, the periodic filter 12 is so designed that the transmittance-wavelength characteristic shifts by $\Delta L$ for a temperature variation $\neq T$. With this measure, locking points are located on shoulders of one type of the transmittance-wavelength characteristic.

The transmittance rate being the same target value exist on a right shoulder and a left shoulder of the transmittance-wavelength characteristic. In this case, the number of wavelengths at which the laser can oscillate is also taken into consideration.

The wavelength-tunable stabilized laser can be configured in the same manner as in the conventional one except for the periodic filter 12. Therefore, this makes it possible to utilize conventional multi-wavelength wavelength locking apparatuses and WDM light sources when the periodic filter is replaced and the controlling part 14 is finely adjusted.

Embodiment 2
(Configuration)

A second embodiment is directed to a wavelength-tunable stabilized laser suitable for use in a light source of an 8-wave WDM optical signal. In a WDM optical signal, ch0 to ch7 wavelengths are arranged in the 1,550 nm wavelength band at wavelength spacing of 0.8 nm according to the ITU-T recommendation.

Referring to FIG. 2, a laser diode (LD) 101-1 can emit laser beams of four wavelengths corresponding to ch0 to ch3, respectively. The LD 101-1 emits laser light having one of the four wavelengths in accordance with the device temperature and the driving current value. The laser beam output from the LD 101-1 is input to a coupler 102.

Similarly, an LD 101-2 can emit laser beams of four wavelengths corresponding to ch4 to ch7, respectively. Emitted laser light is input to the coupler 102.

The LD 101-2 emits laser light corresponding to ch4 at the same device temperature as the LD 101-1 emits laser light corresponding to ch0. The LD 101-2 emits laser light corresponding to ch5 at the same device temperature as the LD 101-1 emits laser light corresponding to ch1. The LD 101-2 emits laser light corresponding to ch6 at the same device temperature as the LD 101-1 emits laser light corresponding to ch2. The LD 101-2 emits laser light corresponding to ch7 at the same device temperature as the LD 101-1 emits laser light corresponding to ch3.

In this embodiment, the LDs 101-1 and 101-2 are designed as follows. The LDs 101-1 and 101-2 are so designed as to emit laser beams corresponding to ch0 and ch4, respectively, when the device temperature is 16° C., emit laser beams corresponding to ch1 and ch5, respectively, when the device temperature is 24° C., emit laser beams corresponding to ch2 and ch6, respectively, when the device temperature is 32° C., emit laser beams corresponding to ch3 and ch7, respectively, when the device temperature is 40° C.

Figure 3A:
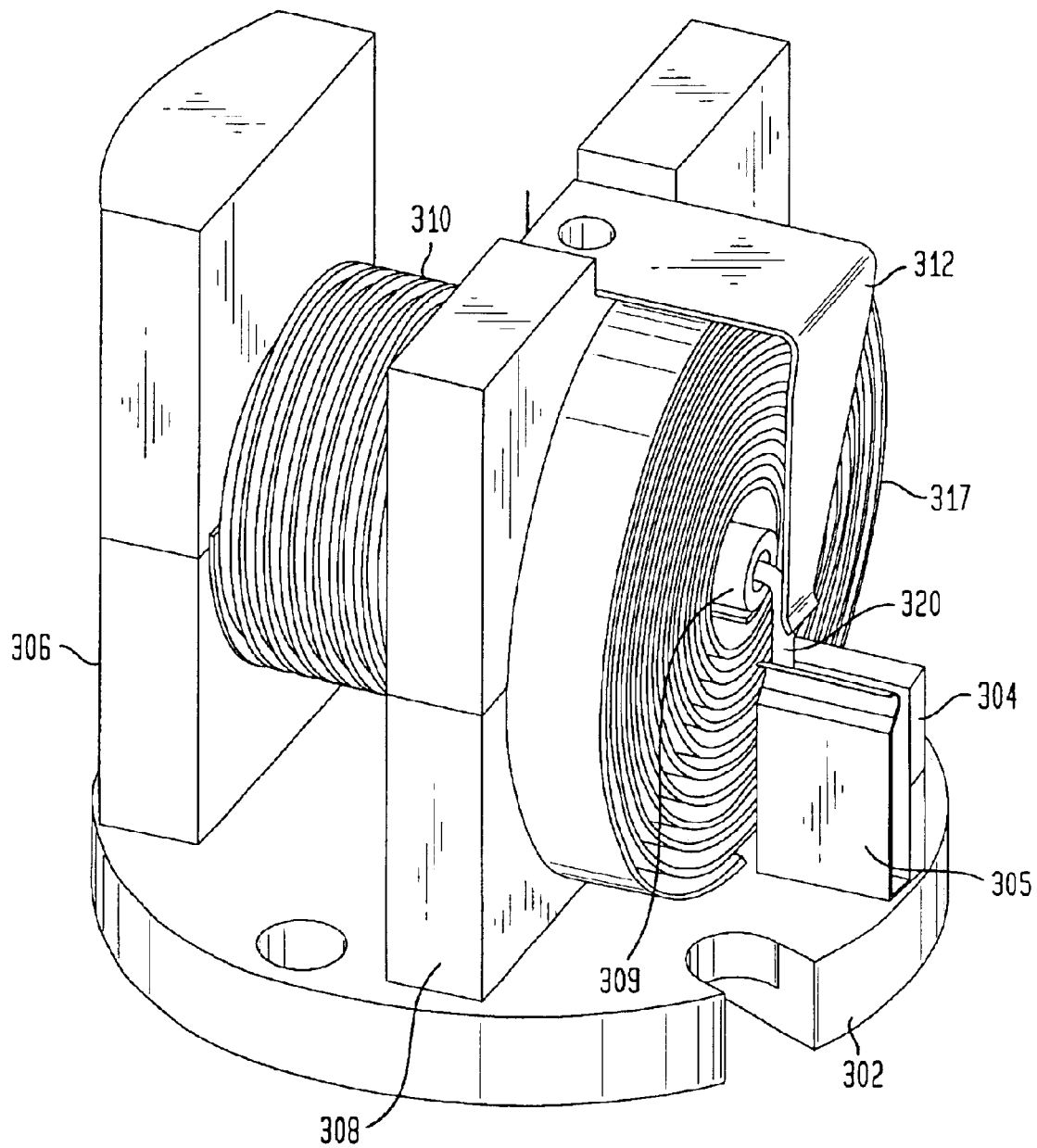
FIG. 3 shows a relationship among device temperatures, channels, and oscillation wavelengths of each LD in the second embodiment.
Figure 3C:
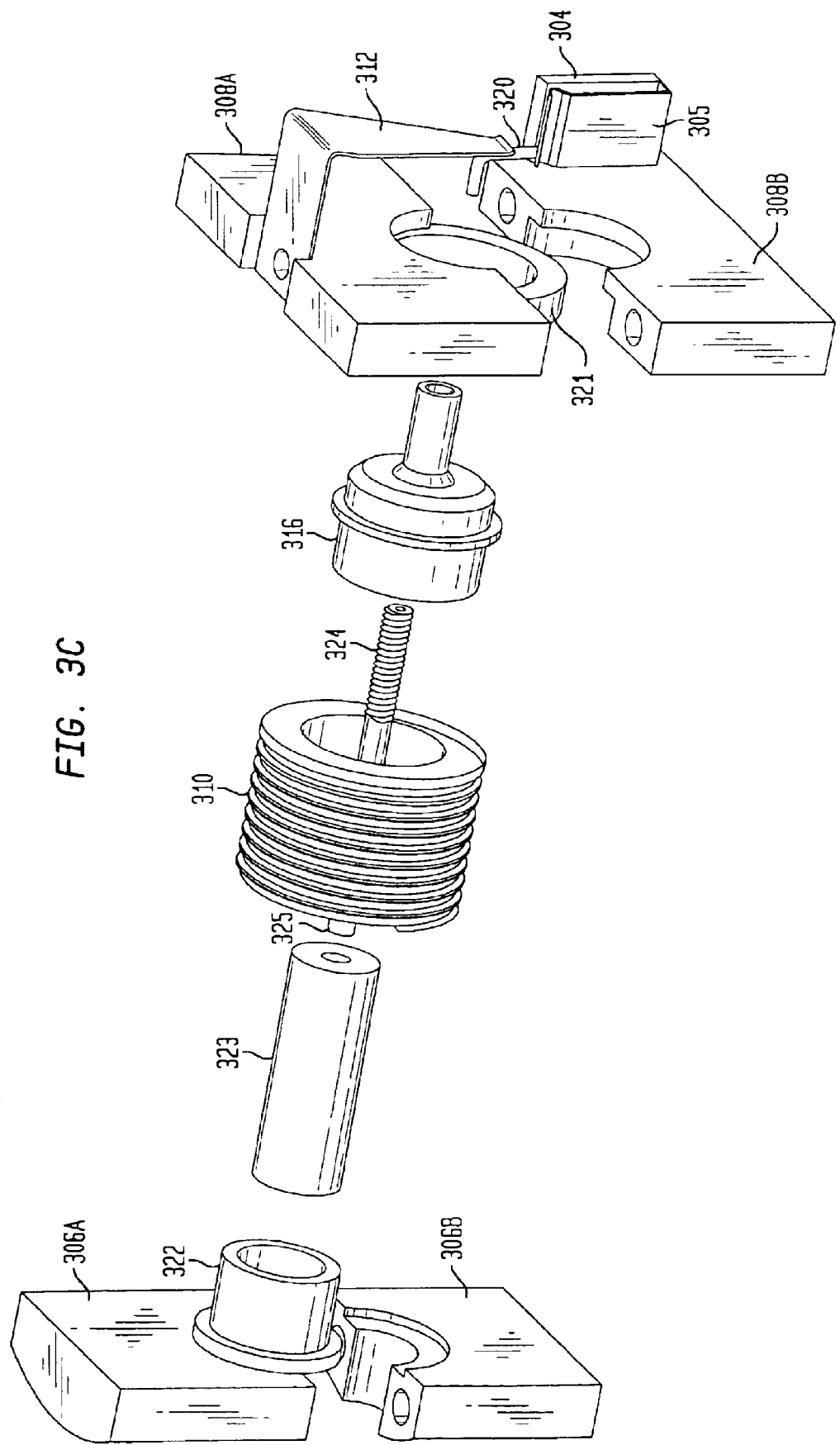

FIG. 3 shows a relationship between the oscillation wavelengths of each LD 101 and the channels.

The MQW DFB laser, the wavelength-tunable DBR laser, or the like can be used as the LDs 101. In particular, the MQW laser is better than the ordinary distributed feedback laser and DBR laser in that the optical gain is large and the threshold value is small, the optical gain spectrum width is narrow and hence the emission spectrum width is narrow, high-speed modulation is possible, and TE waves are selected preferentially.

The LDs 101 and the coupler 102 constitute an LD array part. Under a control described later, the LD array part supplies laser light having one of the eight wavelengths to a coupler 103.

The laser light is branched into three by the coupler 103. The first branched laser light is input to a coupler 123 via an ISO 121 and a semiconductor optical amplifier (SOA) 122. The second branched laser light is input to a PD 105-1 via an ET filter 104. The third branched laser light is input to a PD 105-2. Since the first laser light finally becomes an output of the wavelength-tunable stabilized laser, it is preferable that its light intensity be higher than the light intensity of each of the second and third laser beams.

The PD 105-1 generates a current corresponding to the light intensity of the received laser light and outputs a resulting electrical signal to an analog-to-digital converter (A/D) 116-1. The A/D 116-1 converts the received analog signal into a digital signal and supplies it to a control center processing unit (CPU) 108. An output value of the A/D 116-1 corresponding to the light intensity of the laser light output from the ET filter 104, is represented by PDo1.

Similarly, a PD 105-2 generates a current corresponding to the light intensity of the received laser light and a resulting electrical signal is supplied to the CPU 108 via an A/D 116-2. An output value of the A/D 116-2 corresponding to the light intensity of the laser light directly input from the coupler 103 to the PD 105-2, is represented by PDo2.

PDo1/PDo2 is a value corresponding to transmittance of the ET filter 104. Although the transmittance of the ET filter 104 can be determined by using only PDo1, normalizing PDo1 by PDo2 makes it possible to compensate for a variation in PDo1 due to noise, deterioration with age, or the like. Since the CPU 108 calculates PDo1/PDo2, it is preferable that laser light input from the coupler 103 to the ET filter 104 and laser light input from the coupler 103 to the PD 105-2 have the same light intensity.

Figure 4:
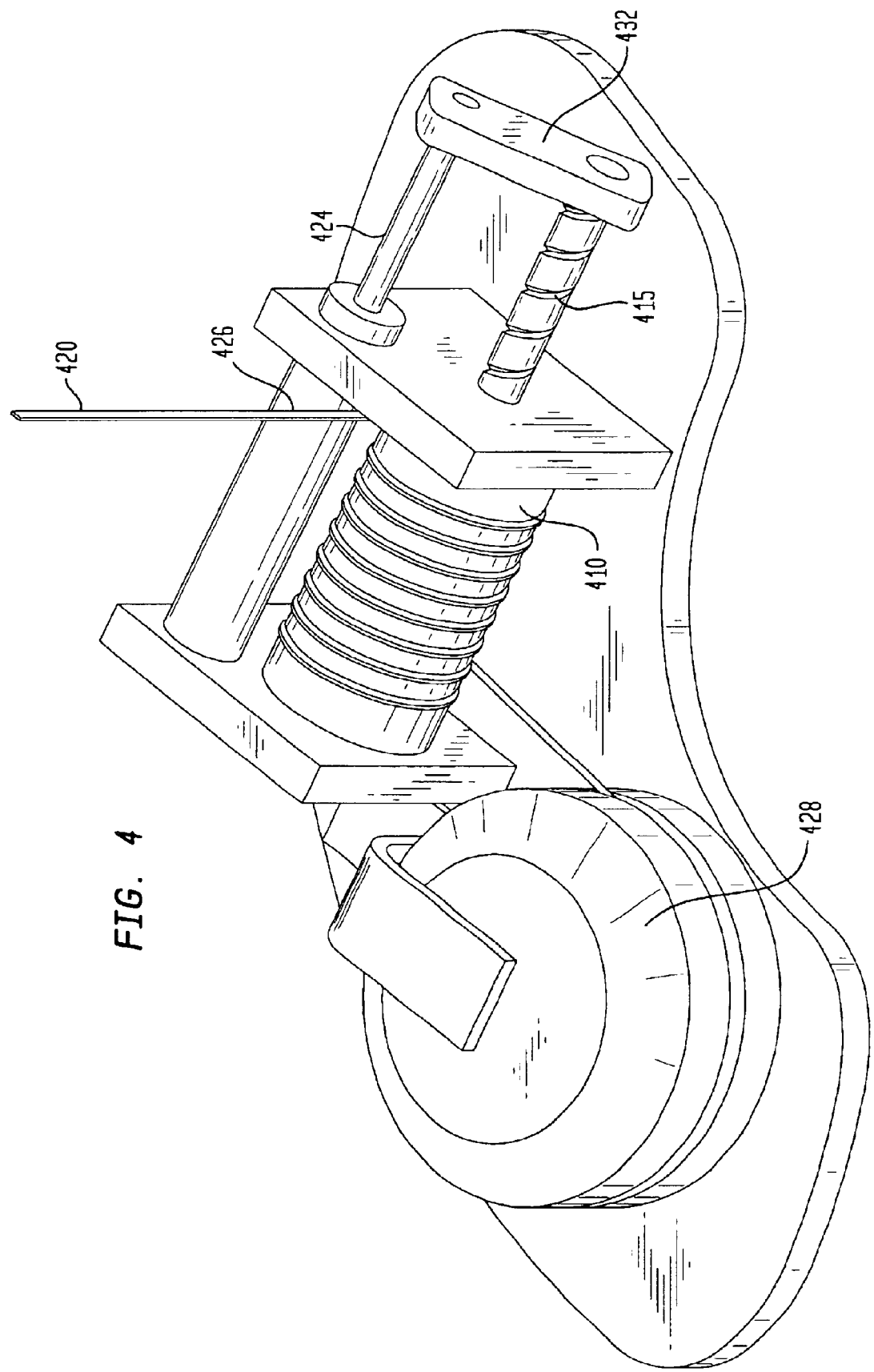
FIG. 4 shows a relationship between transmittance-wavelength characteristics and locking points of respective channels in the second embodiment.

FIG. 4 shows a relationship between transmittance-wavelength characteristics and locking points of the respective channels. The vertical axis of FIG. 4 represents PDo1/PDo2, that is, the value corresponding to the transmittance of the ET filter 104 and the horizontal axis represents the channel (wavelength). Each curve represents a transmittance-wavelength characteristic at each of temperatures 16° C., 24° C., 32° C., and 40° C. (from the top). Black dots "•" on each curve indicate locking points of respective channels, that is, target values that are used for control for attaining a desired oscillation wavelength.

The FSR of the ET filter 104, which is a periodic filter, is set equal to the wavelength spacing of a WDM optical signal. In this embodiment, since the wavelength spacing is 0.8 nm, the FSR is set at 0.8 nm. It is noted that 0.8 nm corresponds to 100GHz in the 1,550-nm wavelength band. In this embodiment, the ET filter 104 is made of quartz glass. Therefore, the transmittance-wavelength characteristic of the ET filter 104 shifts to the longer wavelength side by about 0.22 nm as the device temperature changes from 16° C. to 40° C.

By setting the FSR of the ET filter 104 equal to the wavelength spacing of laser beams that can be output from the LD array part as described above, the target values for laser beams that can be emitted from the LDs 101-1 and 101-2 at the same device temperature can be equalized as shown in FIG. 4. Here, the target value for ch0 and ch4 is named a first target value, the target value for ch1 and ch5 is named a second target value, the target value for ch2 and ch6 is named a third target value, and the target value for ch3 and ch7 is named a fourth target value.

As shown in FIG. 4, the extremums of the ET filter 104 are so designed that the first to fourth target values are located on left shoulders of the transmittance-wavelength characteristics. The full width at half maximum of the ET filter 104 is so designed that the first to fourth target values are located on left shoulders of the transmittance-wavelength characteristics when shift amounts of the transmittance-wavelength characteristic are taken into consideration. Since the transmittance-wavelength characteristic of the ET filter 104 shifts to the longer wavelength side as the device temperature increases, the first, second, third, and fourth target values are so set as to decrease in this order.

Figure 5:
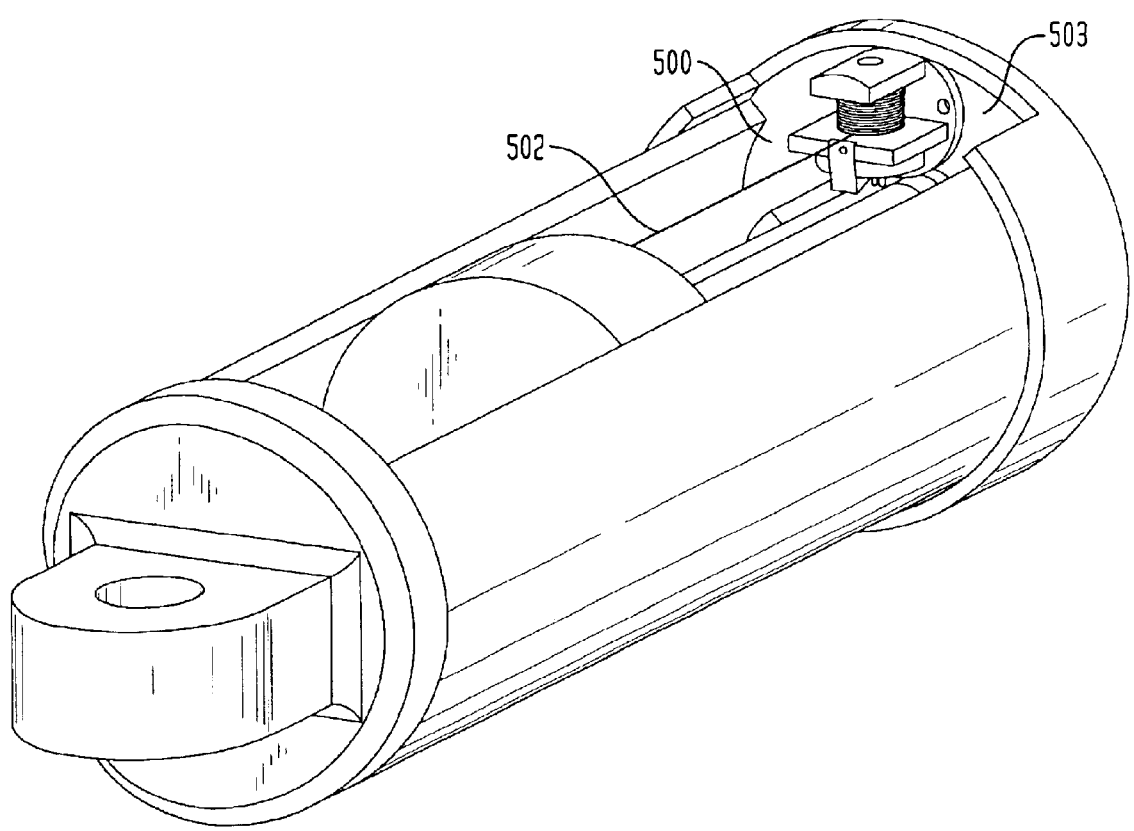
FIG. 5 is a graph that is drawn as if locking points were located on a shoulder of a single transmittance-wavelength characteristic in the second embodiment.

When a graph is drawn as if the target values were located on a left shoulder of a single transmittance-wavelength characteristic, the target values would be arranged as shown in FIG. 5. In FIG. 5, the spacing between the wavelengths that have the target values is equal to a length determined by the temperature dependence which is transmittance-wavelength characteristic. In this embodiment, the device temperature is changed by about 8° C. to change the channel from a certain channel to the adjacent channel and the transmittance-wavelength characteristic shifts to the longer wavelength side by about 0.075 nm as the device temperature is increased by about 8° C. Therefore, the spacing between wavelengths that have the target values is equal to about 0.075 nm.

A shoulder range of the transmittance-wavelength characteristic where each target value can be located can be designed in the following manner. When a target value is located close to a local maximum, PDo1/PDo2 varies to a large extent when the oscillation wavelength varies only slightly. On the other hand, when a target value is located close to a local minimum, the signal-to-noise ratio of PDo1/PDo2 becomes small. In either case, it is difficult to stabilize the oscillation wavelength of the LDs 101.

In this embodiment, since as described above the transmittance-wavelength characteristic shifts to the longer wavelength side by 0.22 nm and the FSR is 0.8 nm, the ET filter 104 is so designed that the full width at half maximum is equal to 0.38 nm. In this case, the shoulder range of the transmittance-wavelength characteristic where each target value can be located is about 0.25 nm.

It is preferable that the target value corresponding to the center wavelength of the wavelengths at which the LD 101-1 can oscillate be located approximately at the center of the shoulder of the transmittance-wavelength characteristic. In this embodiment, since the LD 101-1 emits laser beams of the four wavelengths corresponding to ch0 to ch3, there is no true center wavelength. Therefore, a wavelength located at the center of the ch1 wavelength and the ch2 wavelength is assumed and a target value corresponding to the thus-assumed wavelength is located approximately at the center of a shoulder of the transmittance-wavelength characteristic, whereby the first to fourth target values are properly located on shoulders while prevented from being located close to extremums of the transmittance-wavelength characteristic. Therefore, the wavelength-tunable stabilized laser can stabilize output laser beams in wavelength with high accuracy.

The feature that the target value corresponding to the center wavelength of a plurality of wavelengths at which an LD can oscillate is set approximately at the center of two adjacent extremums in a transmittance-wavelength characteristic covers the above case where an imaginary target value is set because the number of wavelengths at which the LD can oscillate is an even number.

The designing of the FSR of the ET filter 104 will be described below in a more general manner.

The temperature change necessary to change the oscillation wavelength from a certain wavelength to an adjacent wavelength is given by $\Delta f/R$ °C. where R GHZ/°C. is the temperature dependence of the oscillation wavelength of the LD array part at the oscillation wavelength and $\Delta f$ GHZ is the oscillation wavelength (actually, frequency) spacing. When the LD array part changes the oscillation wavelength by one wavelength spacing, the transmittance-wavelength characteristic of the periodic filter shifts by $Q \times \Delta f/R$ GHz where Q GHz/°C. is the temperature dependence in the transmittance-wavelength characteristic of the periodic filter. Therefore, when the FSR is so designed as to be equal to a value that results from the wavelength spacing minus $Q \times \Delta f/R$ GHz, a locking point can be so set as to have the same transmittance value on the adjacent shoulder having the same shape. In view of this, the FSR GHZ is designed in a range between $\Delta f - Q \times \Delta f/R$ and $\Delta f$.

When the FSR is so designed as to be equal to a half of the spacing between the wavelengths at which oscillation is possible, whereas the locking range is halved the inclinations of the shoulders of the transmittance-wavelength characteristic become steeper and hence the oscillation wavelength can be controlled to a locking point more reliably. In this case, the FSR GHz is designed in a range between $\Delta f/2 - Q \times \Delta f/2R$ and $\Delta f/2$.

Returning to FIG. 2, a temperature adjuster 106 and a temperature detector 107 are connected to a base substrate 110 so as to be in contact with it.

To keep the LDs 101 and the ET filter 104 at the same temperature, the LDs 101, the couplers 102 and 103, the ET filter 104, and the PDs 105 are placed on the base substrate 110. The couplers 102 and 103 and the PDs 105 may not be placed on the base substrate 110.

The temperature adjuster 106 is a device for changing the temperature of the base substrate 110. For example, a Peltier capable of changing a temperature according to the Peltier effect can be used as the temperature adjuster 106. The temperature control of the temperature adjuster 106 is performed in such a manner that the CPU 108 changes the current value of a temperature adjuster driving circuit 112 via a digital-to-analog converter (D/A) 113. The temperature adjuster driving circuit 112 supplies the controlled current to the temperature adjuster 106.

The temperature detector 107 detects the temperature of the base substrate 110. For example, a thermistor or a thermocouple can be used as the temperature detector 107. An output of the temperature detector 107 is input to the CPU 108 via an A/D 115.

The driving current value of an LD driving circuit 111 is controlled by the CPU 108 via a D/A 114. The LD driving circuit 111 supplies the thus-controlled driving current to the LDs 101-1 and 101-2. Supplied with the driving current, the LDs 101-1 and 101-2 generate laser oscillation.

On the other hand, the driving current value, to be used for driving the SOA 112, of an SOA driving circuit 124 is controlled by the CPU 108 via a D/A 126. The SOA driving circuit 124 supplies the thus-controlled driving current to the SOA 122. The SOA amplifies laser light at a gain corresponding to the driving current.

The first laser light that is input from the SOA 122 to the coupler 123 is branched into two parts by the coupler 123.

One branched laser light is output as output light of the wavelength-tunable stabilized laser. The other branched laser light is input to a PD 125. The PD 125 generates a current corresponding to the received laser light, and an output of the PS 125 is input to the CPU 108 via an A/D 127. Based on the output of the PD 125, the CPU 108 judges the light intensity of the laser light that is output from the wavelength-tunable stabilized laser and controls the gain of the SOA 122 via the D/A 126 and the SOA driving circuit 124.

The CPU 108 accesses a memory 109. The memory 109 stores a first program for controlling the wavelength-tunable stabilized laser, initial ignition driving current values of the respective LDs 101, an initial ignition driving current value of the SOA 122, initial ignition control values of the temperature adjuster 106 for the respective temperatures, first to fourth target values, a light intensity target value of laser light to be output from the wavelength-tunable stabilized laser, etc.

The initial ignition driving current values of the LDS 101 are set for the respective channels. Since as shown in FIG. 4 only one locking point corresponding to each channel is located on one shoulder of the transmittance-wavelength characteristic, the initial ignition driving current values of the LDS 101 are so set that the LDS 101 oscillate in a wavelength range corresponding to the shoulder range of the transmittance-wavelength characteristic including the locking point. For example, the initial ignition driving current value of the LD 101-2 corresponding to ch5 is set at such a value that the LD 101-2 ignites in the locking range for ch5 shown in FIG. 4.

Since in the vicinity of the extremums it is difficult to control the oscillation wavelength so as to attain a locking point for the same reasons as described above, it is preferable to exclude wavelength ranges close to the extremums.

(Principle of operation and advantages)

Next, the control of the wavelength-tunable stabilized laser for stabilizing the oscillation wavelength at a desired wavelength will be described.

The CPU 108 starts to execute the first program that is stored in the memory 109 upon application of power, for example.

Figure 6:
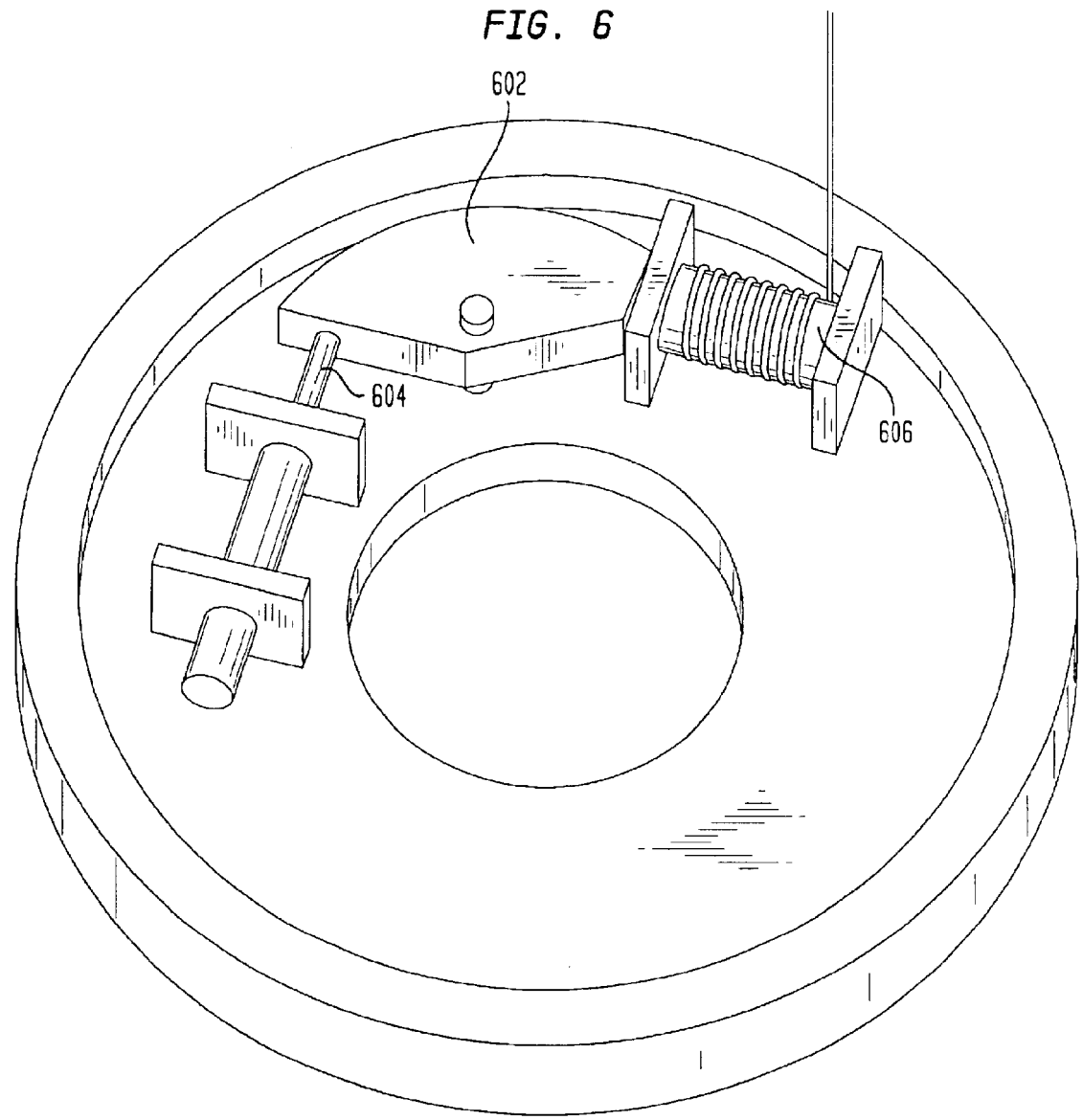
FIG. 6 is a flowchart showing an oscillation stabilizing control according to the second embodiment.

As shown in FIG. 6, at step S1, the CPU 108 initializes the individual circuits in the wavelength-tunable stabilized laser.

At step 2, the CPU 108 judges whether the wavelength-tunable stabilized laser has received a channel ignition request. When no channel ignition request has been received, step S2 is repeatedly executed until a channel ignition request is received.

Where the wavelength-tunable stabilized laser is used as a light source of a transmission station of a WDM optical communication system, for example, a channel ignition request (setting of an oscillation wavelength) is input to the CPU 108 from a controlling apparatus that supervises the transmission station.

When a channel ignition request has been received, at step S3 the CPU 108 reads, from the memory 109, an initial ignition drive current value of the LD 101-1 or 101-2 corresponding to chX, the initial ignition driving current value of the SOA 122, an initial ignition control value of the temperature adjuster 106 to attain a temperature corresponding to chX, a target value corresponding to chX, and the light intensity target value of laser light to be emitted from the wavelength-tunable stabilized laser.

For example, a request for igniting the wavelength-tunable stabilized laser for ch2, the CPU 108 reads the initial ignition driving current value of the LD 101-1, the initial ignition driving current value of the SOA 122, the initial ignition control value of the temperature adjuster 106 to attain 32° C., the third target value, and the light intensity target value of laser light to be emitted from the wavelength-tunable stabilized laser.

At step S4, the CPU 108 starts the temperature adjuster 106 by supplying the thus-read initial ignition control value of the temperature adjuster 106 to the temperature adjuster driving circuit 112 via the D/A 113.

At step S5, the CPU 108 supplies the initial ignition driving current of the LD 101 corresponding to chX to the LD 101 via the D/A 114 and the LD driving circuit 111. Supplied with the driving current, the LD 101 starts to emit laser light.

At step S6, the CPU 108 monitors the output of the temperature detector 107 that is input via the A/D 115. At step S7, the CPU 108 judges whether the difference between the detected temperature and the temperature corresponding to chX is smaller than a predetermined allowable value.

When it is judged that the difference is not smaller than the allowable value, steps S6 and S7 are executed again. On the other hand, when it is judged that the difference is smaller than the allowable value, at step S8 the CPU 108 captures PDo1 and PDo2 and calculates PDo1/PDo2.

At step S9, the CPU 108 calculates the difference between the calculated PDo1/PDo2 value and the target value corresponding to chX by subtracting the former from the latter and judges whether the difference is smaller than a predetermined allowable value. The calculation of the difference between the calculated PDo1/PDo2 value and the target value corresponds to calculation of the difference between a current oscillation wavelength of the LD 101 and the chX wavelength.

When it is judged that the calculated difference is not smaller than the allowable value, at step S10 the CPU 108 changes the oscillation wavelength by changing the device temperature of the LD 101 by means of the temperature adjuster 106. And the process returns to step S8.

The direction of changing the device temperature of the LD 101 is determined in the following manner. Since the locking point is located on the left shoulder of the transmittance-wavelength characteristic, a calculated difference being positive indicates that the oscillation wavelength is on the shorter wavelength side of the locking point. Therefore, the CPU 108 changes the device temperature so that the oscillation wavelength becomes longer. Conversely, since a calculated different being negative indicates that the oscillation wavelength is on the longer wavelength side of the locking point, the CPU 108 changes the device temperature so that the oscillation wavelength becomes shorter.

On the other hand, when it is judged that the calculated difference is smaller than the allowable value, the CPU 108 judges that the oscillation wavelength has been stabilized (locked) at the chX wavelength. At step S11, the CPU 108 starts the SOA 122 by supplying the read-out initial ignition driving current value of the SOA 122 to the SOA driving circuit 124 via the D/A 126.

At step S12, the CPU 108 controls the oscillation wavelength so that it is kept constant by monitoring the output of the PD 125 that is supplied via the A/D 127 and judges whether the difference between the output value of the PD 125 and the light intensity target value of laser light is smaller than a predetermined allowable value (APC control).

In this manner, in the wavelength-tunable stabilized laser, the wavelength of laser light is stabilized at the desired chX wavelength.

To make switching from chX to chY, the CPU 108 executes the above-described steps S3 to S12 again.

In the wavelength-tunable stabilized laser, the wavelengths of laser beams that can be emitted from the LDs 101-1 and 101-2 at the same device temperature can be stabilized by setting the FSR of the ET filter 104 equal to the spacing between wavelengths at which oscillation is possible. In the wavelength-tunable stabilized laser, the wavelengths of laser beams that can be emitted from a single LD 101 at different device temperatures can be stabilized by setting target values on shoulders of the transmittance-wavelength characteristic for respective wavelengths at which the single LD 101 can oscillate.

Therefore, the wavelength-tunable stabilized laser can emit laser light having a stabilized wavelength at all wavelengths at which oscillation is possible.

Although in the second embodiment the CPU 108 controls the light intensity of laser light so that it is kept constant, the invention is not limited to such a case. For example, the CPU 108 may control the SOA 122 so that its gain is kept constant by utilizing the output of the PD 105-2.

Embodiment 3
(Configuration)

In the second embodiment, to generate oscillation of laser light having a wavelength corresponding to a desired channel, an LD ignition wavelength is set in a locking range corresponding to the desired channel. Although even in this case the wavelength-tunable stabilized laser can emit laser light whose wavelength is stabilized at the wavelength corresponding to the desired channel, it is difficult to stabilize the oscillation wavelength at the wavelength of a locking point that is set close to an extremum of the transmittance-wavelength characteristic. This is because the locking point deviates from the center of the locking range to the longer or shorter wavelength side.

In view of the above, in a wavelength-tunable stabilized laser according to a third embodiment, control is made in such a manner that oscillation is started with the initial ignition wavelength of an intended channel set at a wavelength located approximately at the center of a shoulder of the transmittance-wavelength characteristic that is closest to the wavelength corresponding to the intended channel and then the oscillation wavelength is changed to the wavelength corresponding to the intended channel.

The configuration of the wavelength-tunable stabilized laser according to the third embodiment is the same as that of the second embodiment except for a memory 159 that replaces the memory 109 and hence will not be described except for the memory 159.

In the third embodiment, the memory 159 is used in place of the memory 109 shown in FIG. 2. The memory 159 stores a second program (described later) for controlling the wavelength-tunable stabilized laser, initial ignition driving current values of the respective LDs 101, an initial ignition driving current value of the SOA 122, initial ignition control values of the temperature adjuster 106 for the respective temperatures, first to fourth target values, a light intensity target value of laser light to be output from the wavelength-tunable stabilized laser, etc. The initial ignition driving current values of the LDs 101 are set for the respective channels.

Figure 7:
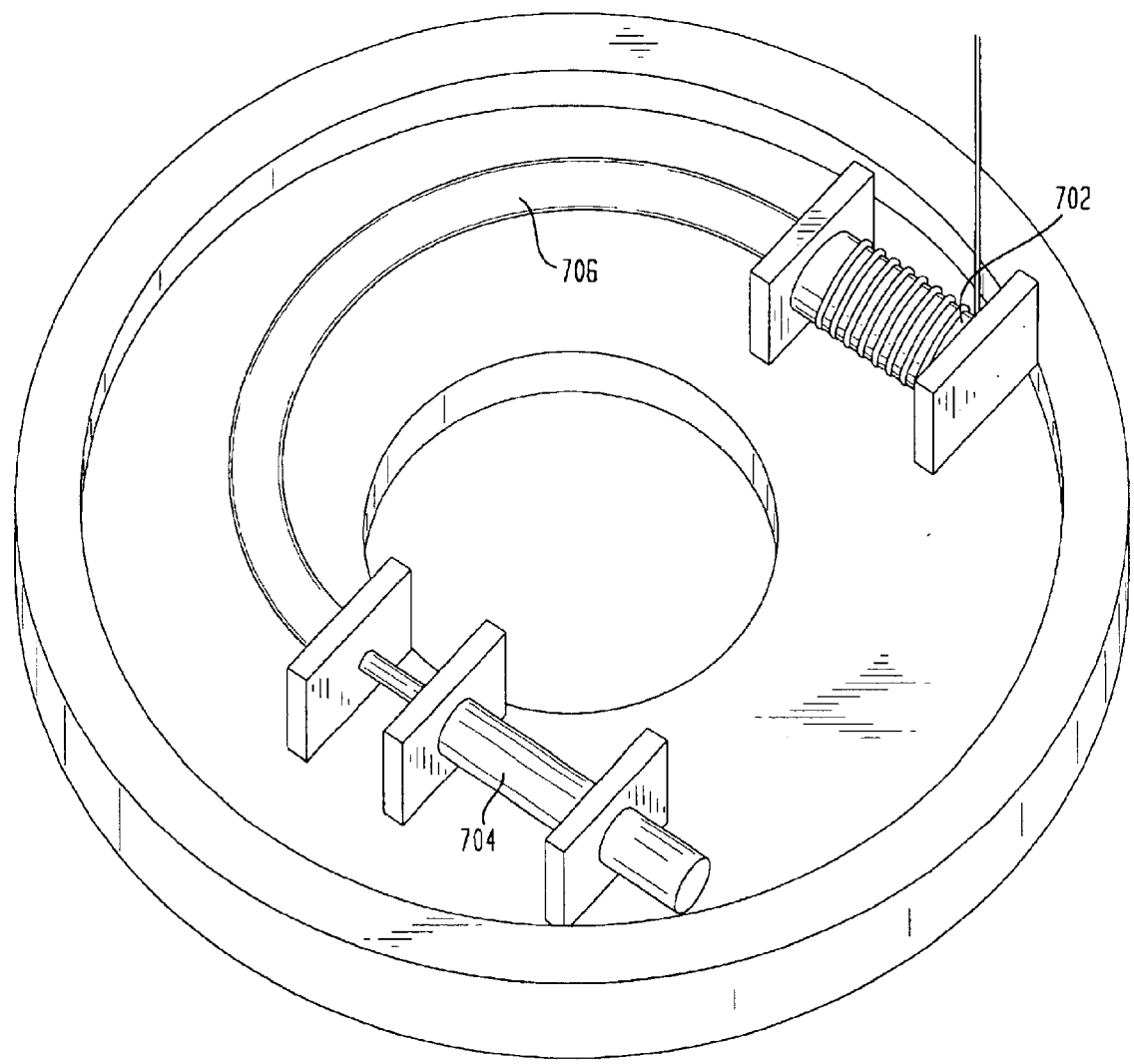
FIG. 7 shows a relationship between a locking point and an initial ignition wavelength of each channel in a third embodiment of the invention.

A relationship between the locking point and the initial ignition wavelength of each channel according to the third embodiment will be described below with reference to FIG. 7. In FIG. 7, the vertical axis represents PDo1/PDo2 and the horizontal axis represents the channel (wavelength). Curves represent transmittance-wavelength characteristics at respective temperatures of 16° C., 24° C., 32° C., and 40° C. (from the top). Black dots "•" on each characteristic curve indicate locking points of respective channels, that is, target values to be used for control for attaining a desired oscillation wavelength. Black squares "■." on each characteristic curve indicate initial ignition wavelengths of respective channels, that is, wavelengths at which an LD 101 starts oscillating when supplied with an initial ignition driving current therefor. As described above, each initial ignition current value of the LDs 101 is a value that generates oscillation of the LDs 101 at a wavelength located approximately at the center of a shoulder of the transmittance-wavelength characteristic that is closest to the wavelength corresponding to an intended channel This value will be described below in a more general manner.

Assume that the wavelength dependence of the LD driving current is S nm/mA and the width of the locking range of the periodic filter having the locking point at the center is ±W [nm]. For channels located on both ends, it is possible to generate oscillation of the LD at a wavelength located approximately at the center of a shoulder of the transmittance-wavelength characteristic by igniting the LD with the current value deviated by ±W/S mA.

(Principle of operation and advantages)

Next, the control of the wavelength-tunable stabilized laser for stabilizing the oscillation wavelength at a desired wavelength will be described.

The CPU 108 starts to execute the second program that is stored in the memory 159 upon application of power, for example.

Figure 8:
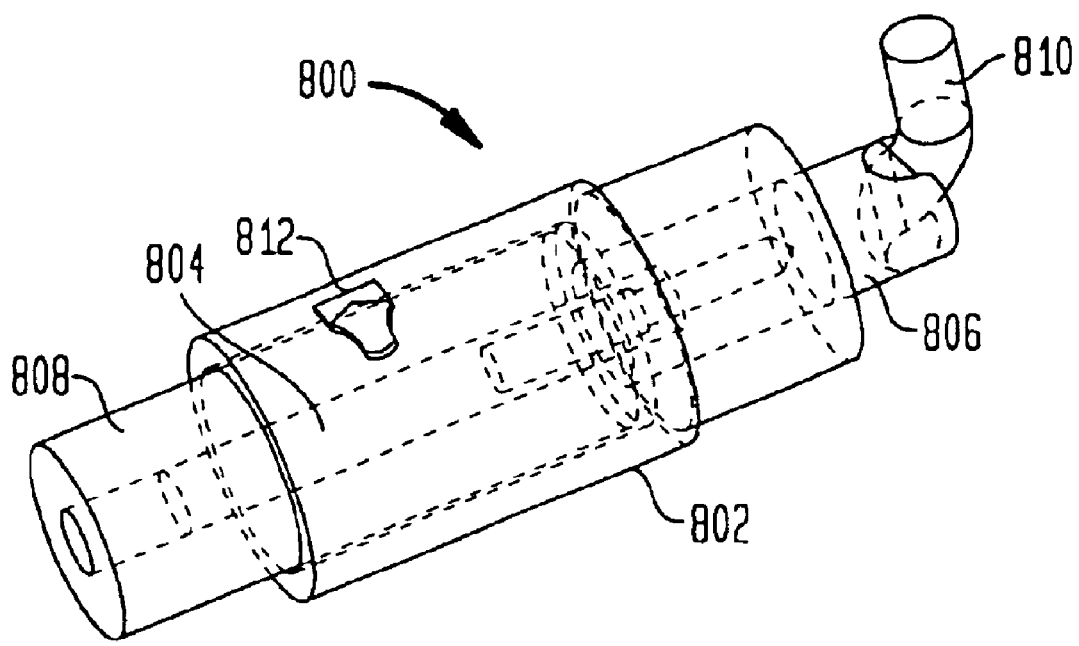
FIG. 8 is a flowchart showing an oscillation stabilizing control according to the third embodiment.

Step S1 (where the individual circuits of the wavelength-tunable stabilized laser are initialized) to step S7 (where the output of the temperature detector 107 is rendered in a steady state) in FIG. 8 that are executed by the CPU 108 are the same as those in FIG. 6 (second embodiment), and hence will not be described.

In the third embodiment, since an initial ignition driving current value of an LD 101 corresponding to chX is different from that in the second embodiment, the LD starts to emit laser light at a wavelength that is different from that in the second embodiment.

When it is judged at step S7 in FIG. 8 that the detected temperature corresponds to chX, at step S21 the CPU 108 captures PDo1 and PDo2 and calculates PDo1/PDo2.

At step S22, the CPU 108 calculates the difference between the calculated PDo1/PDo2 value and the target value corresponding to chX by subtracting the former from the latter and judges whether the difference is smaller than a predetermined allowable value. The calculation of the difference between the calculated PDo1/PDo2 value and the target value corresponds to calculation of the difference between the current oscillation wavelength and the chX wavelength.

When it is judged that the calculated difference is not smaller than the allowable value, at step S23 the CPU 108 changes the oscillation wavelength by changing the driving current of the LD 101 by means of the LD driving circuit 111. When the calculated difference is smaller than the allowable value, the CPU 108 executes step S27 (described later).

The direction of changing the driving current of the LD 101 is determined in the following manner. Where the locking point is located on the local maximum side of a wavelength approximately at the center of a left shoulder of the transmittance-wavelength characteristic, the ignition wavelength is always located on the shorter wavelength side of the intended oscillation wavelength. Therefore, the CPU 108 changes the driving current so that the oscillation wavelength becomes longer. As shown in FIG. 7, ch0, ch1, ch4, and ch5 correspond to this case.

Conversely, where the locking point is located on the local minimum side of a wavelength approximately at the center of a left shoulder of the transmittance-wavelength characteristic, the ignition wavelength is always located on the longer wavelength side of the intended oscillation wavelength. Therefore, the CPU 108 changes the driving current so that the oscillation wavelength becomes shorter. As shown in FIG. 7, ch2, ch3, ch6, and ch7 correspond to this case.

At step S24, the CPU 108 again captures PDo1 and PDo2 and calculates PDo1/PDo2. At step S25, the CPU 108 calculates the difference between the calculated PDo1/PDo2 value and the target value by subtracting the former from the latter and judges whether the difference is smaller than a predetermined allowable value.

When it is judged that the calculated difference is not smaller than the allowable value, at step S26 the CPU 108 changes the oscillation wavelength by changing the driving current of the LD 101 by means of the LD driving circuit 111. And the process returns to step S24.

The direction of changing the driving current of the LD 101 is determined in the following manner. Since the locking point is located on a left shoulder of the transmittance-wavelength characteristic, a calculated difference being positive indicates that the oscillation wavelength is on the shorter wavelength side of the locking point. Therefore, the CPU 108 changes the driving current so that the oscillation wavelength becomes longer. Conversely, since a calculated difference being negative indicates that the oscillation wavelength is on the longer wavelength side of the locking point, the CPU 108 changes the driving current so that the oscillation wavelength becomes shorter.

On the other hand, when it is judged that the calculated difference is smaller than the allowable value, the CPU 108 judges that the oscillation wavelength has been stabilized (locked) at the chX wavelength. At step S27, the CPU 108 starts the SOA 122 by supplying its initial ignition driving current to the SOA driving circuit 124 via the D/A 126.

At step S28, the CPU 108 controls the oscillation wavelength so as to be kept constant by monitoring the output of the PD 125 that is supplied via the A/D 127 and judges whether the difference between the output value of the PD 125 and the light intensity target value of laser light is smaller than a predetermined allowable value (APC control).

In this manner, in the wavelength-tunable stabilized laser, the wavelength of laser light is stabilized at the desired chX wavelength.

To make switching from chX to chY, the CPU 108 executes the above-described steps S3 to S7 and S21 to S28 again.

In addition to the advantages of the second embodiment, the wavelength-tunable stabilized laser according to the third embodiment provides with following advantages. Since the initial ignition wavelength of an LD 101 is set approximately at the center of a shoulder of the transmittance-wavelength characteristic, the first oscillation wavelength changing direction is determined correctly and hence the oscillation wavelength is not changed in a wrong direction. Therefore, the wavelength-tunable stabilized laser can oscillate in such a manner that the oscillation wavelength is stabilized at a desired chx wavelength more reliably. Further, there does not occur an event that the wavelength-tunable stabilized laser emits laser light whose wavelength is deviated from the desired chX wavelength by the FSR of the ET filter 104.

The light intensity of laser light that is output from the LDs 101 varies because the driving current is changed to adjust the oscillation wavelength. However, this variation component can be compensated because the wavelength-tunable stabilized laser according to the third embodiment is provided with the SOA 122.

In general, in the saturation range, the output light intensity of the optical amplifier does not vary to a large extent while input light intensity does.

Therefore, it is preferable that the SOA 122 be used in the saturation range. In this case, a saturation driving current value for rendering the SOA 122 in the saturation range is stored in the memory 159 in place of or in addition to the initial ignition driving current value of the SOA 122. Where both driving current values are stored, the CPU 108 starts the SOA 122 by using the initial ignition driving current value and then switches the driving current value to the saturation driving current value.

Where the SOA 122 is used in the saturation range as described above, the output variation of the PD 125 is small even when the input light intensity of the SOA 122 varies owing to a variation in LD driving current. Therefore, the wavelength-tunable stabilized laser can easily control the light intensity of output laser light.

In particular, in the case of a transmission station having a large allowable value for a light intensity variation of a light source, step S28 can be omitted.

Although in the second and third embodiments the SOA 122 is disposed between the couplers 103 and 123, it may be disposed between the couplers 102 and 103. This configuration makes it possible to form the LDs 101, the coupler 102, and the SOA 122 on the same semiconductor substrate in an integral manner. Further, since these components can be formed on the same semiconductor substrate, the compact wavelength-tunable stabilized laser including the optical amplifier can be manufactured so as to be small in size. In this case, control is so made that the SOA 122 starts to be driven at step S4 in FIG. 6 or FIG. 8 by using the initial ignition driving current value of the SOA 122. This is because in general the optical amplifier is a light absorber when it is not driven and hence when it is not driven laser light whose intensity is large enough to be detected by the PD 105 may not be input to the coupler 103.

Embodiment 4
(Configuration)

A fourth embodiment is directed to a wavelength-tunable stabilized laser suitable for use in a light source of an 8-wave WDM optical signal. In a WDM optical signal, ch0 to ch7 wavelengths are arranged in the 1,550-nm wavelength band at wavelength spacing of 0.8 nm according to the ITU-T recommendation.

Figure 9A:
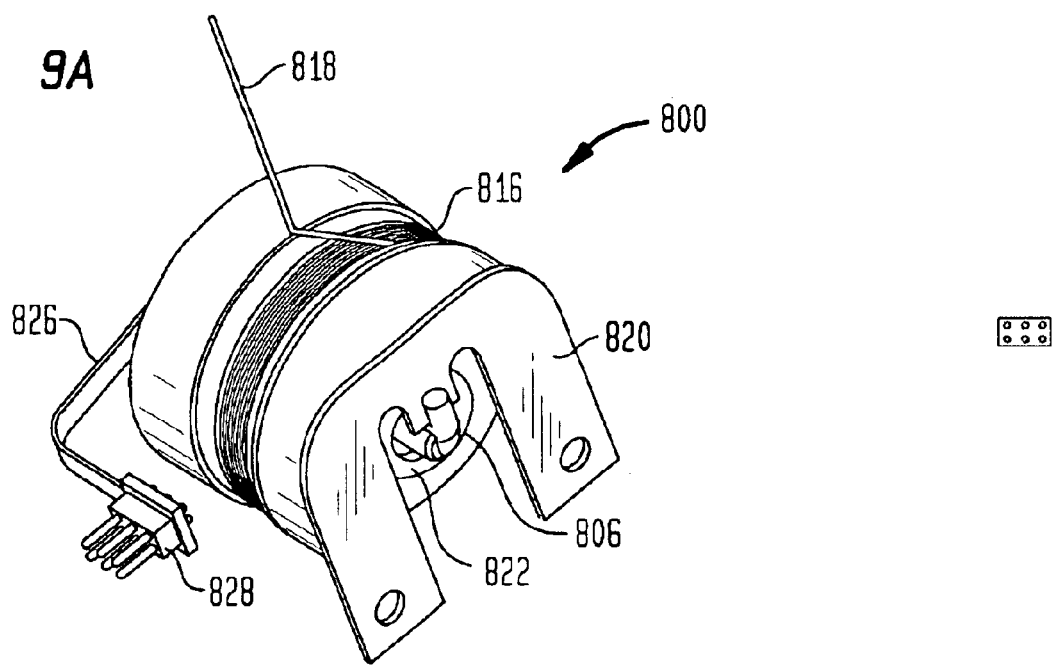
FIG. 9 shows the configuration of a wavelength-tunable stabilized laser according to a fourth embodiment of the invention.
Figure 9B:
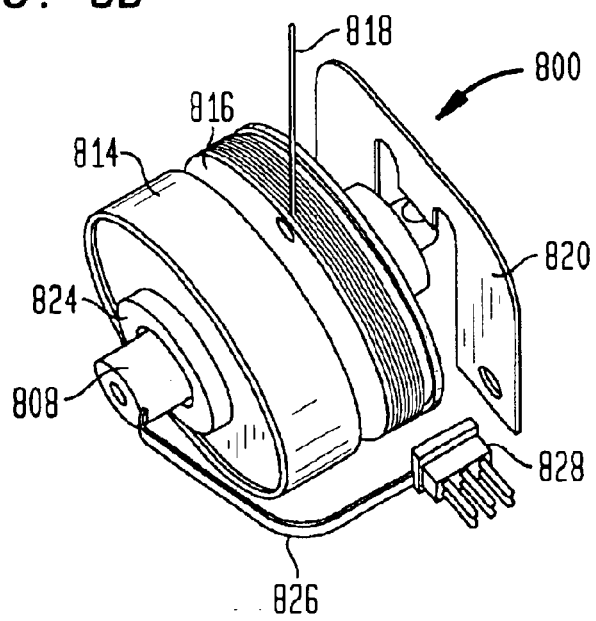

Referring to FIG. 9, LDs 101-1 and 101-2 supply laser beams to a coupler 102. The LDs 101 and the coupler 102 constitute an LD array part. Being controlled in a manner described later, the LD array part supplies laser light having one of eight wavelengths to a coupler 151.

The laser light is branched by the coupler 151 into three parts. The first branched laser light is input to a coupler 123 via an ISO 121 and an SOA 122.

The second branched laser light is input to a coupler 152-1, where it is further branched into two parts. One branched laser light is input to a PD 154-1 via an ET filter 153-1 and the other branched laser light is input to a PD 154-2 via an ET filter 153-2.

The third branched laser light is input to a coupler 152-2, where it is further branched into two parts. One branched laser light is input to a PD 154-3 via an ET filter 153-3 and the other branched laser light is input to a PD 154-4.

The PD 154-1 generates a current corresponding to the light intensity of the received laser light and supplies a resulting electrical signal to an A/D 155-1. The A/D 155-1 converts this analog signal into a digital signal and supplies it to a control CPU 108. An output value of the A/D 155-1 corresponding to the light intensity of the laser light that is output from the ET filter 153-1, is represented by PDo1.

Similarly, the PD 154-2 generates a current corresponding to the received laser light and supplies a resulting electrical signal to the CPU 108 via an A/D 155-2. An output value of the A/D 155-2 corresponding to the light intensity of the laser light that is output from the ET filter 153-2, is represented by PDo2.

The PD 154-3 generates a current corresponding to the light intensity of the received laser light and supplies a resulting electrical signal to the CPU via an A/D 155-3. An output value of the A/D 155-3 corresponding to the light intensity of the laser light that is output from the ET filter 153-2, is represented by PDo3.

The PD 154-4 generates a current corresponding to the light intensity of the received laser light and supplies a resulting electrical signal to the CPU 108 via an A/D 155-4. An output value of the A/D 155-4 corresponding to the light intensity of the laser light that is directly input from the coupler 103 to the PD 154-4, is represented by PDo4.

PDo1/PDo4 is a value corresponding to transmittance of the ET filter 153-1. Similarly, PDo2/PDo4 is a value corresponding to transmittance of the ET filter 153-2 and PDo3/PDo4 is a value corresponding to transmittance of the ET filter 153-3.

A relationship between transmittance-wavelength characteristics of the respective ET filters 153 and locking points of the respective channels according to the fourth embodiment will be described below with reference to FIG. 10.

Figure 10A:
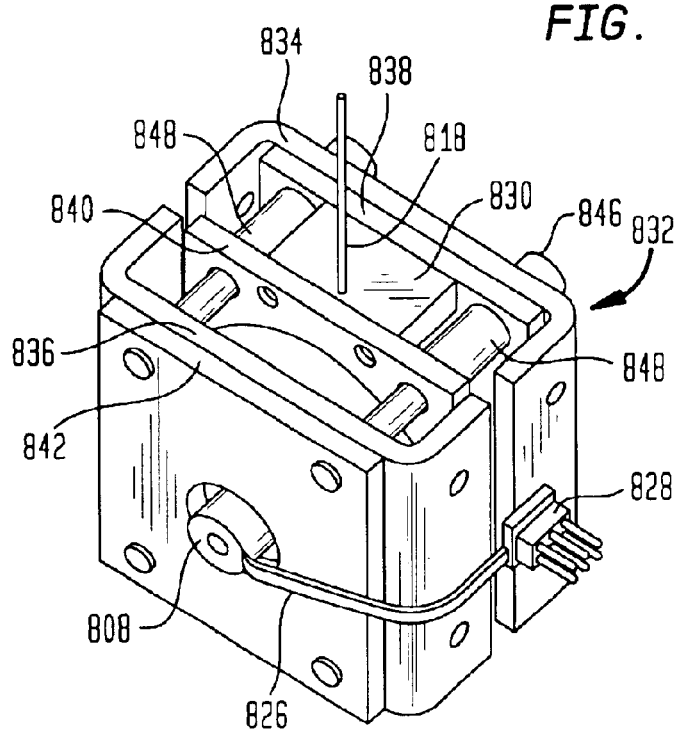
FIG. 10 shows a relationship between transmittance-wavelength characteristics of respective ET filters and locking points of respective channels in the fourth embodiment.
Figure 10B:
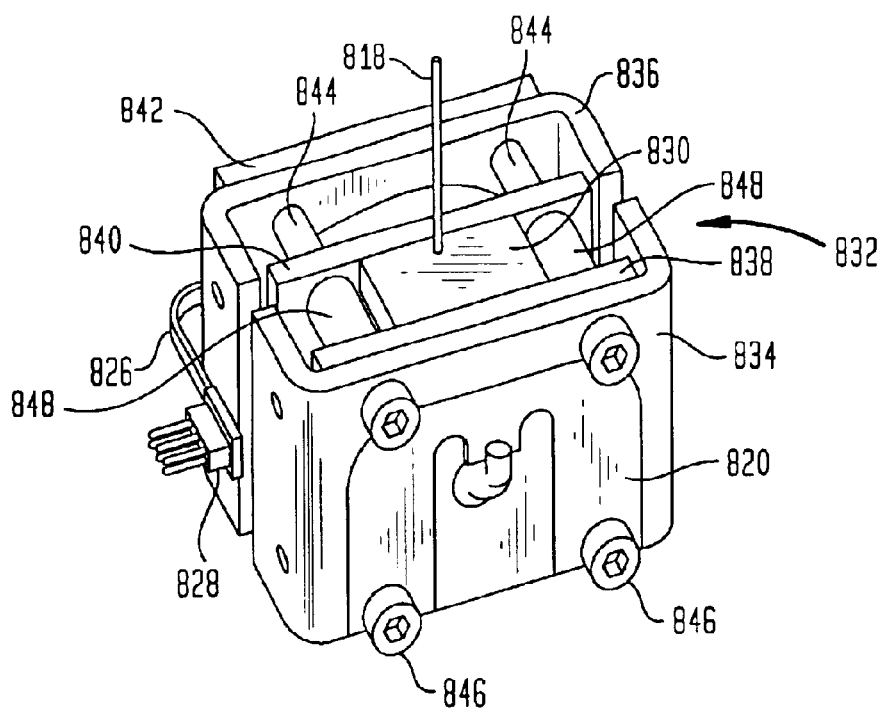

The vertical axis of FIG. 10 corresponds to the transmittance of each ET filter 153 and the horizontal axis represents the channel (wavelength). Each curve represents a transmittance-wavelength characteristic of each ET filter 153 at each of temperatures 16° C., 24° C., 32° C., and 40° C. (from the top). A black dot "•" on each curve indicates a locking point of each channel, that is, a target value that is used for control for attaining a desired oscillation wavelength.

The ET filters 153 are periodic filters whose transmittance-wavelength characteristic is the same in temperature dependence. The number of ET filters 153 is so determined that each wavelength spacing is divided into a plurality of regions and a shoulder of the transmittance-wavelength characteristic exists in each divisional region. Providing the ET filters 153 in this manner allows a locking point corresponding to each channel to be located on a shoulder of one of the ET filters 153. Therefore, by setting a target value for each channel, the wavelength-tunable stabilized laser can emit laser light stably at a wavelength corresponding to each channel based on such a target value.

In this embodiment, each wavelength (actually, frequency) spacing of 100 GHz is divided into five regions. ET filters having an FSR of about 90 GHz are used and are so designed that their transmittance-wavelength characteristics deviate from each other by 20 GHz at the same temperature as shown in FIG. 10. With this design, shoulders of the ET filter 153-1 can be assigned to the first and third regions, shoulders of the ET filter 153-2 can be assigned to the second and fourth regions, and shoulders of the ET filter 153-3 can be assigned to the third and fifth regions. Therefore, it is sufficient to use three ET filters.

Although in this embodiment three filters having an FSR of about 90 GHz are used as the ET filters 153, the invention is not limited to such a case. For example, two filters having an FSR of 110 GHz may be used as the ET filters 153. In this case, each wavelength spacing of 100 GHz may be divided into four regions and the two ET filters may be so designed that their transmittance-wavelength characteristics deviate from each other by 25 GHz. Two or three PDs 154 may be used in accordance with the number of ET filters.

In general, the number of ET filters can be determined in the following manner.

Let D GHz represent a range of one shoulder of an ET filter where wavelength locking can be attained. Then, when both shoulders are used, the range of the ET filter where wavelength locking can be attained is 2D GHz per one period (i.e., one FSR).

Let Δf GHz represent the oscillation wavelength spacing (actually, frequency spacing). Then, the above-mentioned ET filter has Δf/FSR peaks in the range of Δf. For example, where the wavelength spacing is 75 GHz and the FSR of the ET filter is 25 GHz, the ET filter has three peaks in the 75 GHz range.

That is, the range of a single ET filter in Δf GHz where wavelength locking can be attained is given by 2D×Δf/FSR GHz.

Since a single ET filter can attain locking in the range of 2D×Δf/FSR GHz though the range is not continuous, to enable locking in the entire Δf range, Δf/(2D×Δf/FSR)=FSR/2D or more ET filters are necessary.

In actual designing, since FSR/2D is not necessarily an integer, K ET filters are needed, K being an integer obtained by raising the decimals of FSR/2D to a unit. That is, K is a natural number that is greater than or equal to FSR/2D and smaller than FSR/2D+1.

By using K ET filters as described above, locking can be attained in the entire FSR range of the ET filters irrespective of the oscillation wavelength spacing Δf. To attain locking in the entire FSR range, K ET filters are so designed that their peaks are shifted from each other by D GHz.

For example, where the wavelength spacing is 75 GHz, the FSR of the ET filters is 50 GHz, and the range of one shoulder of an ET filter where wavelength locking can be attained is 10 GHz, the number of necessary ET filters is calculated as FSR/2D=50/(2×10)=2.5. Therefore, three ET filter are necessary. By arranging three ET filters in such a manner that their peaks are deviated from each other by 10 GHz, wavelength locking can be attained in the entire range of the wavelength spacing of 75 GHz.

On the other hand, 2D is approximately equal to the full width at half maximum (FWHM), the number of necessary ET filters is also given by FSR/FWHM, which means finesse. That is, the number of necessary ET filters is approximately equal to the finesse of the ET filters used.

Returning to FIG. 9, a temperature adjuster 106 and a temperature detector 107 are connected to a base substrate 110 so as to be in contact with it.

To keep the LDs 101 and the ET filters 153 at the same temperature, the LDs 101, the couplers 102, 151, and 152, the ET filters 153, and the PDs 154 are placed on the base substrate 110. The couplers 102, 151, and 152 and the PDs 154 may not be placed on the base substrate 110.

The CPU 108, which is connected to the temperature adjuster 106 via a D/A 113 and a temperature adjuster driving circuit 112, controls the temperature of the temperature adjuster 106.

The CPU 108, which is also connected to the LDs 101 via a D/A 114 and an LD driving circuit 111, generates laser oscillation of the LDs 101.

The temperature detector 107 detects the temperature of the base substrate 110 and an output of the temperature detector 107 is input to the CPU 108 via an A/D 115.

On the other hand, the CPU 108, which is also connected to the SOA 122 via a D/A 126 and an SOA driving circuit 124, controls the gain of the SOA 122.

The first laser light that is input from the SOA 122 to the coupler 123 is branched into two parts by the coupler 123. One branched laser light is output as output light of the wavelength-tunable stabilized laser. The other branched laser light is input to a PD 125. The PD 125 detects the light intensity of the received laser light and an output of the PD 125 is input to the CPU 108 via an A/D 127.

The CPU 108 accesses a memory 209. The memory 209 stores a third program (described later) for controlling the wavelength-tunable stabilized laser, initial ignition driving current values of the respective LDs 101, an initial ignition driving current value of the SOA 122, initial ignition control values of the temperature adjuster 106 for the respective temperatures, target values that are set for the respective channels and grouped for the ET filters 153-1 to 153-3 to be used for wavelength control, a light intensity target value of laser light to be output from the wavelength-tunable stabilized laser, etc.

The initial ignition driving current values of the LDs 101 are set for the respective channels. Since as shown in FIG. 10 only one locking point corresponding to each channel is located on one shoulder of the transmittance-wavelength characteristic, the initial ignition driving current values of the LDs 101 are so set that the LDs 101 oscillate in a wavelength range corresponding to the shoulder range of the transmittance-wavelength characteristic including the locking point.

(Principle of operation and advantages)

Next, the control of the wavelength-tunable stabilized laser for stabilizing the oscillation wavelength at a desired wavelength will be described.

The CPU 108 starts to execute the third program that is stored in the memory 209 upon application of power, for example.

Figure 11:
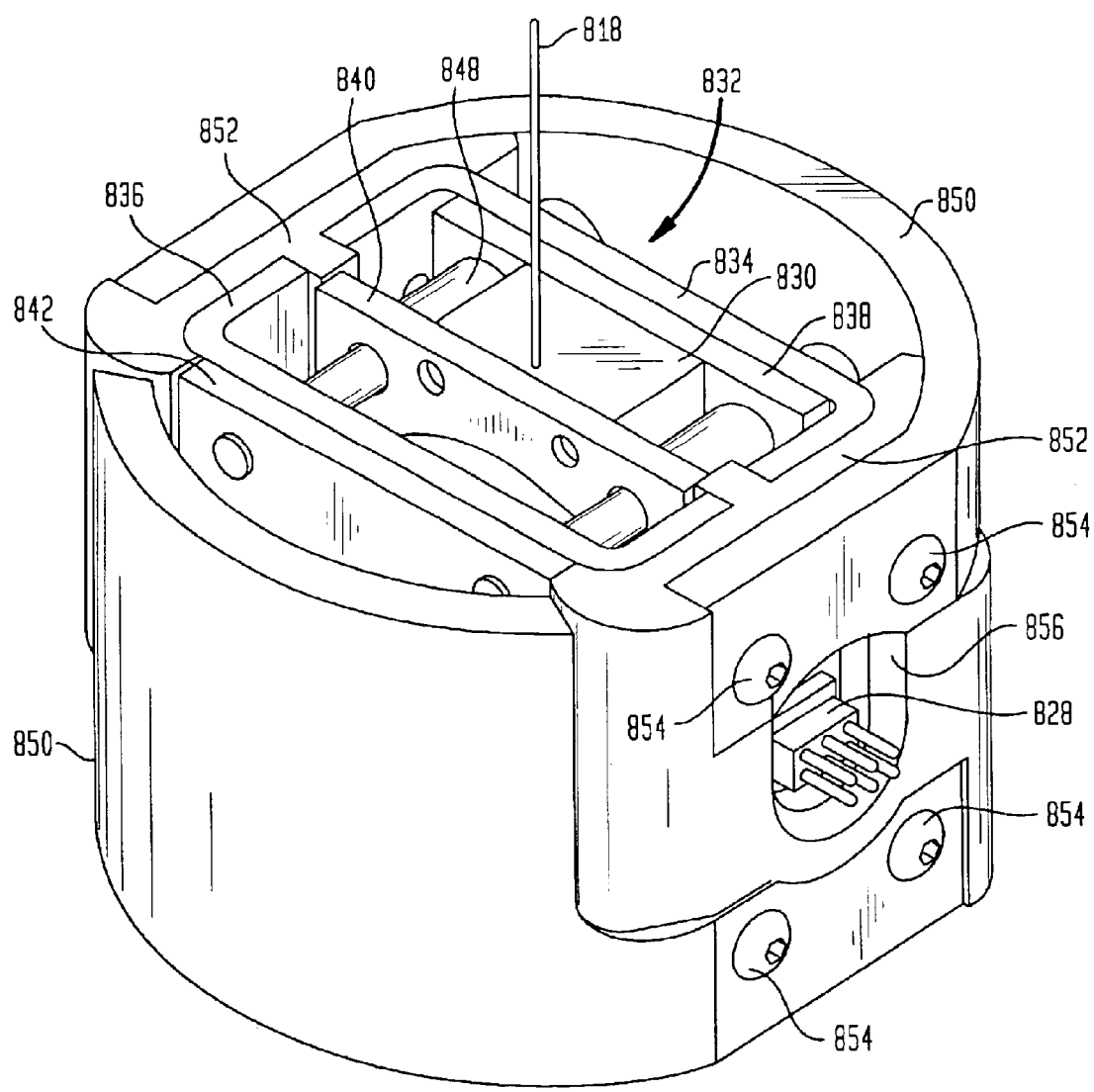
FIG. 11 is a flowchart showing an oscillation stabilizing control according to the fourth embodiment.

Step S1 (where the individual circuits of the wavelength-tunable stabilized laser are initialized) to step S7 (where the output of the temperature detector 107 is rendered in a steady state) in FIG. 11 that are executed by the CPU 108 are the same as those in FIG. 6 (second embodiment), and hence will not be described.

When it is judged at step S7 in FIG. 11 that the detected temperature is equal to the temperature corresponding to chx, the CPU 108 selects a PD 154 for receiving laser light that is output from an ET filter 153 having a transmittance-wavelength characteristic on which the locking point of chX is located. An output of the selected PD 154 is represented by PDoz (z=1, 2, or 3). At step S31, the CPU 108 captures PDoz and PDo4 and calculates PDoz/PDo4.

At step S32, the CPU 108 calculates the difference between the calculated PDoz/PDo4 value and the target value corresponding to chX by subtracting the former from the latter and judges whether the difference is smaller than a predetermined allowable value.

When it is judged that the difference is not smaller than the allowable value, at step S33 the CPU 108 changes the oscillation wavelength by changing the device temperature of the LD 101 by means of the temperature adjuster 106. And the process returns to step S31.

The direction of changing the device temperature of the LD 101 is determined in the following manner. Where the locking point is located on a left shoulder of the transmittance-wavelength characteristic, a calculated difference being positive indicates that the oscillation wavelength is on the shorter wavelength side of the locking point. Therefore, the CPU 108 changes the device temperature so that the oscillation wavelength becomes longer. Conversely, since a calculated different being negative indicates that the oscillation wavelength is on the longer wavelength side of the locking point, the CPU 108 changes the device temperature so that the oscillation wavelength becomes shorter.

Where the locking point is located on a right shoulder of the transmittance-wavelength characteristic, a calculated difference being positive indicates that the oscillation wavelength is on the longer wavelength side of the locking point. Therefore, the CPU 108 changes the device temperature so that the oscillation wavelength becomes shorter. Conversely, since a calculated different being negative indicates that the oscillation wavelength is on the shorter wavelength side of the locking point, the CPU 108 changes the device temperature so that the oscillation wavelength becomes longer.

On the other hand, it is judged that the difference is smaller than the allowable value, the CPU 108 judges that the oscillation wavelength has been stabilized (locked) at the chX wavelength. At step S34, the CPU 108 starts the SOA 122 by supplying its initial ignition driving current value to the SOA driving circuit 124 via the D/A 126.

At step S35, the CPU 108 controls the oscillation wavelength so that it is kept constant by monitoring the output of the PD 125 that is supplied via the A/D 127 and judges whether the difference between the output value of the PD 125 and the light intensity target value of laser light is smaller than a predetermined allowable value (APC control).

In this manner, in the wavelength-tunable stabilized laser, the wavelength of laser light is stabilized at the desired chX wavelength.

To make switching from chX to chY, the CPU 108 executes the above-described steps S3 to S7 and S31 to S35 again.

As described above, in the wavelength-tunable stabilized laser of this embodiment, because of the use of a plurality of ET filters, the target value of each channel can necessarily be located on a shoulder of the transmittance-wavelength characteristic of one of the ET filters. Therefore, the wavelength-tunable stabilized laser can emit, more reliably, laser light that is stabilized at a desired wavelength. Even when a periodic filter is designed so as to have a desired FSR, periodic filter products are manufactured whose FSRs deviate from the desired value. However, by properly setting the number of regions and the number of periodic filters, the invention enables use of such periodic filter products as long as their transmittance-wavelength characteristics are the same in temperature dependence. Enabling the use of periodic filter products whose FSRs deviate from the design value, the invention can increase the yield of periodic filter products.

Embodiment 5

(Configuration)

In the second to fourth embodiments, the wavelength of laser light is locked at the wavelength of each channel through the measures described above because the temperature dependence of the oscillation wavelength of the LDs does not match the temperature dependence in the transmittance-wavelength characteristic of the ET filter as a periodic filter.

In a wavelength-tunable stabilized laser according to a fifth embodiment, the wavelength of laser light is locked at the wavelength of each channel by designing the temperature dependence in the transmittance-wavelength characteristic of the ET filter as a periodic filter in accordance with the temperature dependence of the oscillation wavelength of the LDs.

The configuration of the wavelength-tunable stabilized laser according to the fifth embodiment is the same as in the second embodiment except for LDs 201, an ET filter 204, and a memory 259 that replace the LDs 101, the ET filter 104, and the memory 109 in the second embodiment, and hence will not be described except for these different components.

Figure 12:
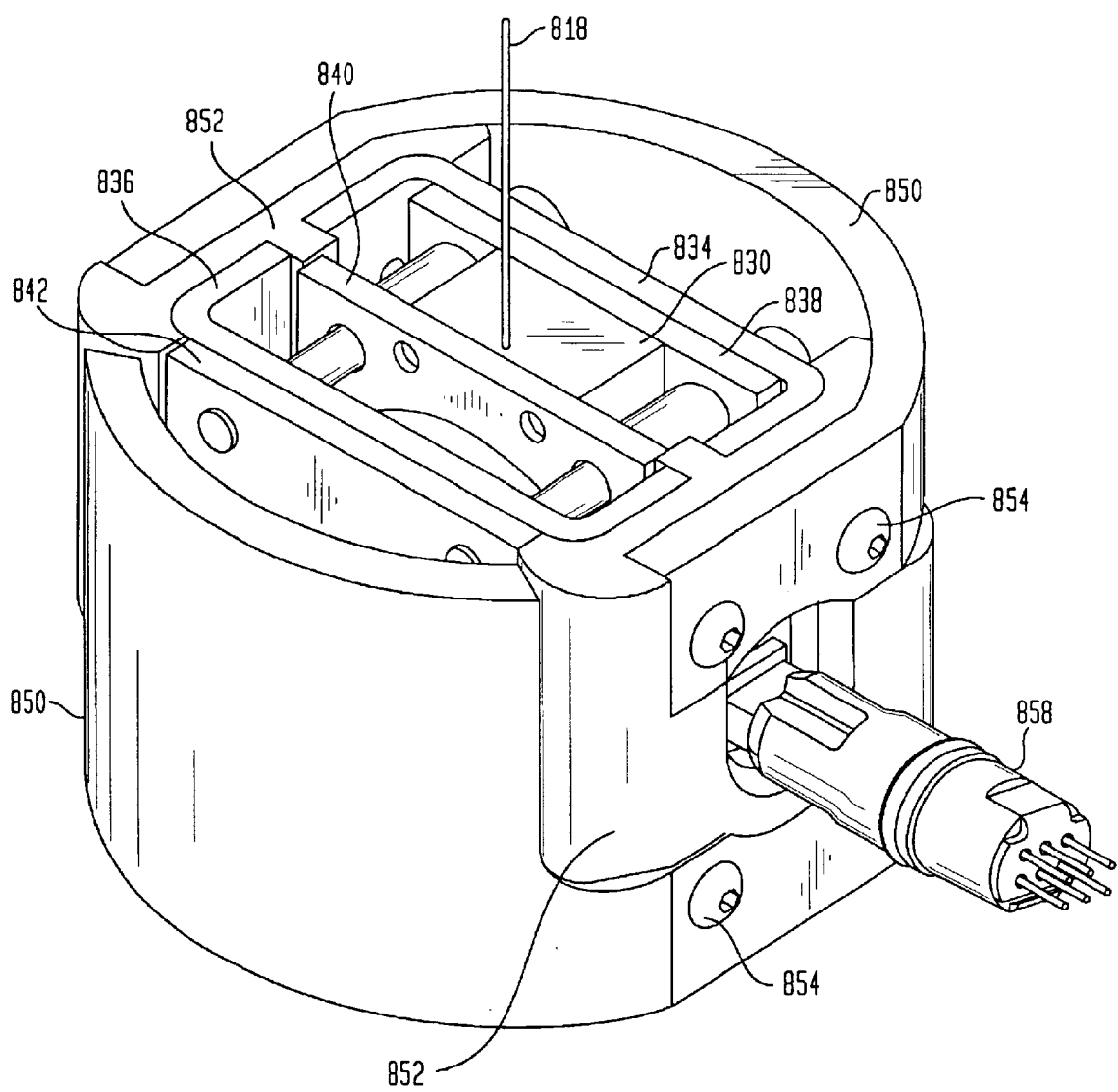
FIG. 12 is a table showing a relationship between device temperatures, channels, and grids of each LD in a fifth embodiment of the invention.

In the fifth embodiment, LDs 201-1 to 201-8 are used in place of the LDs 101 shown in FIG. 2. To enable the wavelength-tunable stabilized laser to oscillate at 32 wavelengths, eight LDs 201 are provided. The LDs 201 are connected optically to the coupler 102 (see FIG. 2) and emitted laser light is input to the coupler 102. Device temperatures, channels, and grids of each LD 201 are set as shown in FIG. 12. In the fifth embodiment, an ET filter 204 is used in place of the ET filter 104 shown in FIG. 2.

A relationship between transmittance-wavelength characteristics and locking points of the respective channels according to the fifth embodiment will be described below with reference to FIG. 13.

Figure 13A:
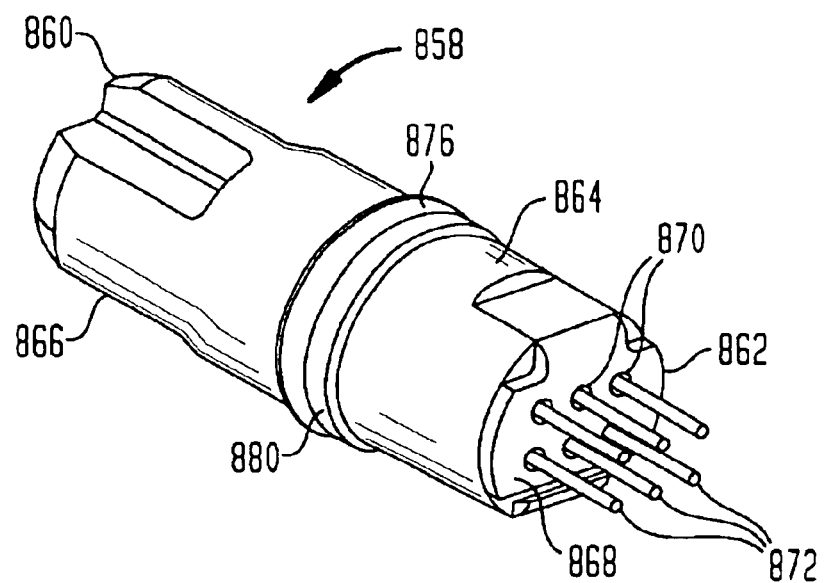
FIG. 13 shows a relationship between transmittance-wavelength characteristics and locking points of respective channels in the fifth embodiment.
Figure 13B:
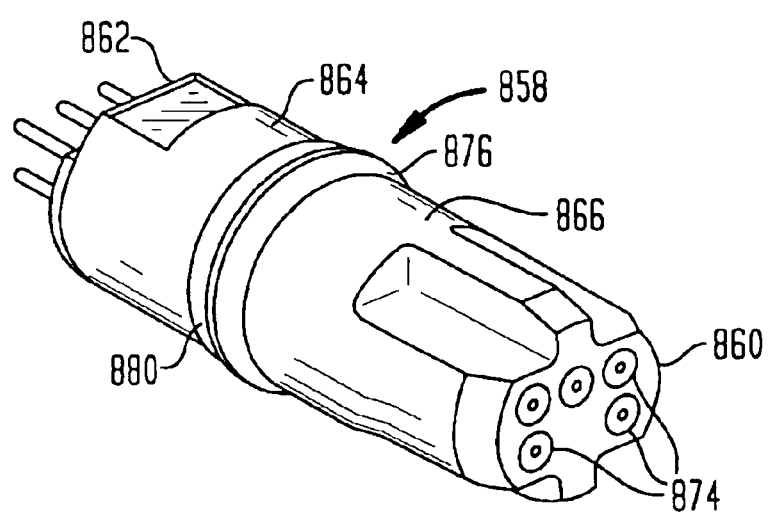

The vertical axis of FIG. 13 corresponds to the transmittance of the ET filter 204 and the horizontal axis represents the channel (wavelength). Each curve represents a transmittance-wavelength characteristic of the ET filter 204 at each of temperatures 16° C., 24° C., 32° C., and 40° C. (from the top). Black dots "•" on each curve indicate locking points of respective channels, that is, target values that are used for control for attaining a desired oscillation wavelength. The part corresponding to ch6 to ch32 are not shown in FIG. 13.

The temperature dependence in the transmittance-wavelength-characteristic of the ET filter 204 is designed in the following manner.

In the fifth embodiment, as shown in FIG. 12, the LD array part can emit laser beams at wavelength spacing (grid spacing) of 0.1 THZ, that is, 100 GHz. Each LD 201 can emit laser beams of four wavelengths that are separated from each other by 100 GHz at 16° C., 24° C., 32° C., and 40° C. That is, the oscillation wavelength of each LD 201 is changed by 100 GHz by changing its device temperature by 8° C. Further, locking points are located on left shoulders of the transmittance-wavelength characteristics of the LDs 201-1, 201-3, 201-5, and 201-7 and on right shoulders of the transmittance-wavelength characteristics of the LDs 201-2, 201-4, 201-6, and 201-8.

The temperature dependence in the transmittance-wavelength characteristic of the ET filter 204 is so designed as to shift to the longer wavelength side by 25 GHz for a one-wavelength temperature change. The FSR of the ET filter 204 is set at 75 GHz.

By designing the ET filter 204 in the above manner, the target values corresponding to the locking points of the respective channels can be equalized.

The temperature dependence in the transmittance-wavelength characteristic of the ET filter 204 is expressed as $25/\neq T$ GHz/° C. where $\Delta T$ is a temperature change that is necessary to change the oscillation wavelength of an LD 201 from a certain wavelength to the wavelength of the adjacent grid.

By designing the ET filter 204 in the above manner, wavelength locking can be attained even when the target value corresponding to the locking point of each channel is set at any transmittance value. However, to stabilize the oscillation wavelength with high accuracy, it is desirable that the locking point of each channel be located approximately at the center of a shoulder of the transmittance-wavelength characteristic as shown in FIG. 13.

An ET filter whose transmittance-wavelength characteristic have such temperature dependence can be manufactured by forming a medium that is interposed between two mirror surfaces opposed to each other by combining a material having a positive linear expansion coefficient with a material having a negative one.

Further, in the fifth embodiment, a memory 259 is used in place of the memory 109 shown in FIG. 2. The memory 259 stores a fourth program (described later) for controlling the wavelength-tunable stabilized laser, initial ignition driving current values of the respective LDs 201, an initial ignition driving current value of the SOA 122, initial ignition control values of the temperature adjuster 106 for the respective temperatures, a target value of locking points, shoulder shapes for the respective LDs 201 on which the locking points are located, a light intensity target value of laser light to be output from the wavelength-tunable stabilized laser, etc.

The initial ignition driving current values of the LDs 201 are set for the respective channels. Since as shown in FIG. 13 only one locking point corresponding to each channel is located on one shoulder of the transmittance-wavelength characteristic, the initial ignition driving current values of the LDs 101 are so set that the LDs 101 oscillate in a wavelength range corresponding to the shoulder range of the transmittance-wavelength characteristic including the locking point.

(Principle of operation and advantages)

Next, the control of the wavelength-tunable stabilized laser for stabilizing the oscillation wavelength at a desired wavelength will be described.

The CPU 108 starts to execute the fourth program that is stored in the memory 259 upon application of power, for example.

Figure 14:
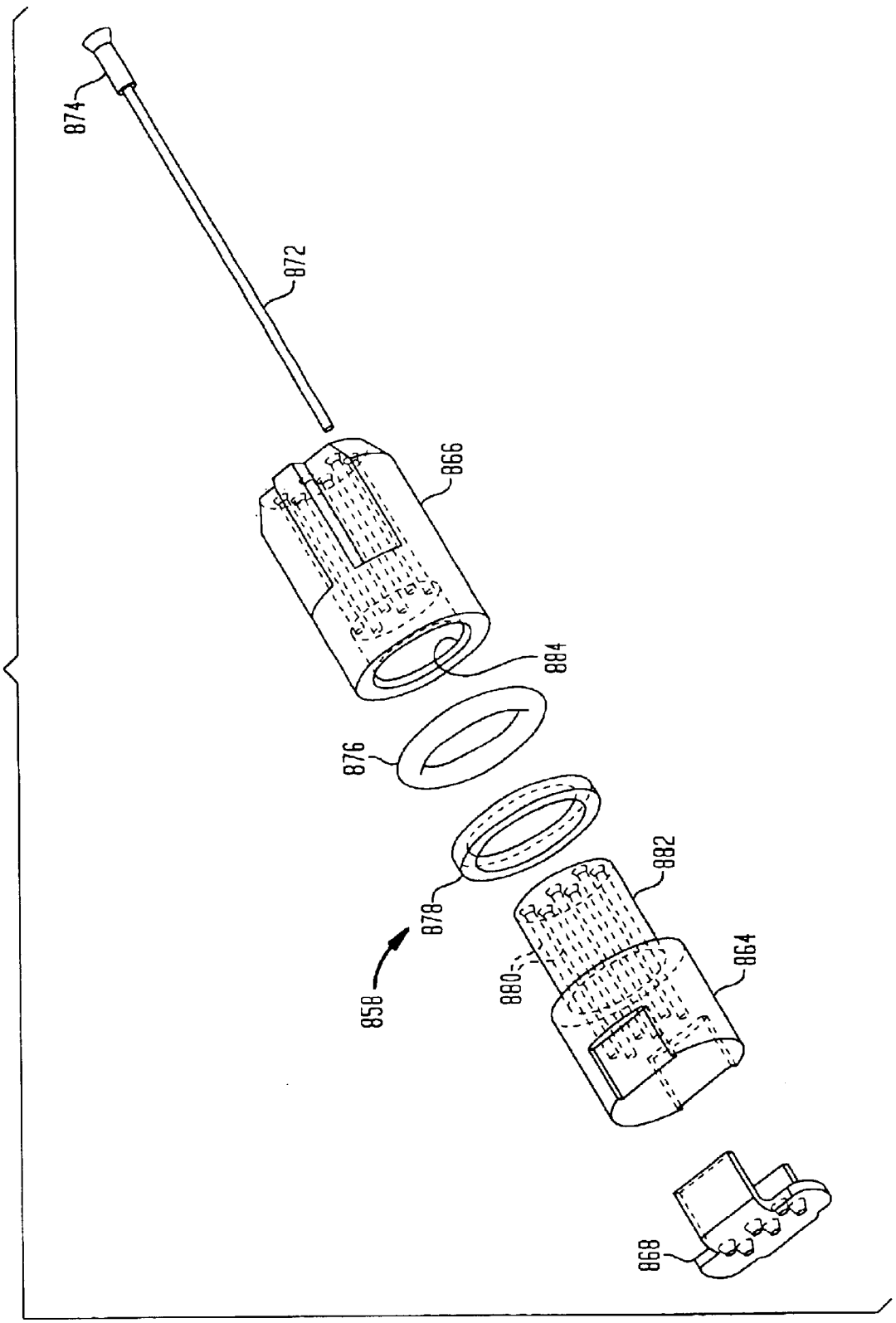
FIG. 14 is a flowchart showing an oscillation stabilizing control according to the fifth embodiment.

Step S1 (where the individual circuits of the wavelength-tunable stabilized laser are initialized) to step S7 (where the output of the temperature detector 107 is rendered in a steady state) in FIG. 14 that are executed by the CPU 108 are the same as those in FIG. 6 (second embodiment), and hence will not be described.

When it is judged at step S7 in FIG. 14 that the detected temperature is equal to the temperature corresponding to chx, at step S41 the CPU 108 captures, from the memory 259, a shape of a shoulder on which the locking point of chX is located. The shoulder shape is a left shoulder when chX corresponds to the wavelength of laser light emitted from one of the LDs 201-1, 201-3, 201-5, and 201-7 and is a right shoulder when chX corresponds to the wavelength of laser light emitted from one of the LDs 201-2, 201-4, 201-6, and 201-8.

At step S42, the CPU 108 captures PDo1 and PDo2 and calculates PDo1/PDo2.

At step S43, the CPU 108 calculates the difference between the calculated PDo1/PDo2 value and the target value by subtracting the former from the latter and judges whether the calculated difference is smaller than a predetermined allowable value.

When it is judged that the calculated difference is not smaller than the allowable value, at step S44 the CPU 108 judges the shoulder shape that was read at step S41.

At step S45, the CPU 108 changes the oscillation wavelength by changing the device temperature of the LD 201 by means of the temperature adjuster 106. And the process returns to step S42.

The direction of changing the device temperature of the LD 201 is determined in the following manner. Where the locking point is located on a left shoulder of the transmittance-wavelength characteristic, a calculated difference being positive indicates that the oscillation wavelength is on the shorter wavelength side of the locking point. Therefore, the CPU 108 changes the device temperature so that the oscillation wavelength becomes longer. Conversely, since a calculated different being negative indicates that the oscillation wavelength is on the longer wavelength side of the locking point, the CPU 108 changes the device temperature so that the oscillation wavelength becomes shorter.

Where the locking point is located on a right shoulder of the transmittance-wavelength characteristic, a calculated difference being positive indicates that the oscillation wavelength is on the longer wavelength side of the locking point. Therefore, the CPU 108 changes the device temperature so that the oscillation wavelength becomes shorter. Conversely, since a calculated different being negative indicates that the oscillation wavelength is on the shorter wavelength side of the locking point, the CPU 108 changes the device temperature so that the oscillation wavelength becomes longer.

On the other hand, it is judged that the difference is smaller than the allowable value, the CPU 108 judges that the oscillation wavelength has been stabilized (locked) at the chX wavelength. At step S46, the CPU 108 starts the SOA 122 by supplying its initial ignition driving current value to the SOA driving circuit 124 via the D/A 126.

At step S47, the CPU 108 controls the oscillation wavelength so that it is kept constant by monitoring the output of the PD 125 that is supplied via the A/D 127 and judges whether the difference between the output value of the PD 125 and the light intensity target value of laser light is smaller than a predetermined allowable value (APC control).

In this manner, in the wavelength-tunable stabilized laser, the wavelength of laser light is stabilized at the desired chX wavelength.

To make switching from chX to chY, the CPU 108 executes the above-described steps S3 to S7 and S41 to S47 again.

In the wavelength-tunable stabilized laser having the above configuration, since the temperature dependence in the transmittance-wavelength characteristic of the ET filter 204 is adjusted in accordance with the temperature dependence of the oscillation wavelength of the LDs 201, the target values corresponding to the locking points of the respective channel can be equalized and laser light that is stabilized at a desired wavelength can be output in a more reliable manner.

Although in the fifth embodiment the ET filter 104 is designed in such a manner that the temperature dependence in the transmittance-wavelength characteristic is $25/\Delta T$ GHz/° C. and the FSR is 75 GHz, the invention is not limited to such a case.

In general, the ET filter is designed in the following manner in a case where a plurality of LDs are provided each of which can oscillate at n wavelengths having spacing of $\Delta f$ GHz.

Where the wavelength spacing (actually, frequency spacing) is different from the FSR of the ET filter, the ET filter is so designed that it has temperature dependence ($\Delta f \times$FSR)/$\Delta T$ GHz/°C. and that ($\Delta f \times n$)/FSR is an integer.

For example, where a plurality of LDs are provided each of which can oscillate at four wavelength having spacing of 50 GHz, the ET filter may be so designed that the FSR is 40 GHz and the temperature dependence is $10/\Delta T$ GHZ/° C., that the FSR is 20 GHz and the temperature dependence is $30/\Delta T$ GHz/° C., or that the FSR is 25 GHz and the temperature dependence is $25/\Delta T$ GHz/° C.

Where the wavelength spacing $\Delta f$ is equal to the FSR of the ET filter, the ET filter is so designed as to have temperature dependence of FSR/$\Delta T$ GHz/° C.

As another example, where the LD array part has a plurality of LDs each of which can oscillate at four wavelengths having spacing of 100 GHz, the ET filter may be so designed that the temperature dependence in the transmittance-wavelength characteristic is 100/8 GHz/° C. and the FSR is 100 GHZ.

Where the LD array part has a plurality of LDs each of which can oscillate at four wavelengths having spacing of 100 GHz, the ET filter may be so designed that the temperature dependence in the transmittance-wavelength characteristic is 50/8 GHZ/° C. and the FSR is 50 GHz.

Where the LD array part has a plurality of LDs each of which can oscillate at four wavelengths having spacing of 100 GHz, the ET filter may be so designed that the temperature dependence in the transmittance-wavelength characteristic is 25/8 GHz/° C. and the FSR is 50 GHz.

Further, where the LD array part has a plurality of LDs each of which can oscillate at four wavelengths having spacing of 100 GHz, the ET filter may be so designed that the temperature dependence in the transmittance-wavelength characteristic is 20/8 GHz/° C. and the FSR is 80 GHz.

Embodiment 6

(Configuration)

A sixth embodiment is directed to a wavelength-tunable stabilized laser in which the temperatures of the light source and the periodic filter are independently controlled due to their different temperature dependences.

The oscillation wavelengths of the light source are ch0 to ch7 wavelengths arranged in the 1,550-nm wavelength band at wavelength spacing of 0.8 nm according to the ITU-T recommendation so that so that the light source can be used for an 8-wave WDM optical signal.

Figure 15:
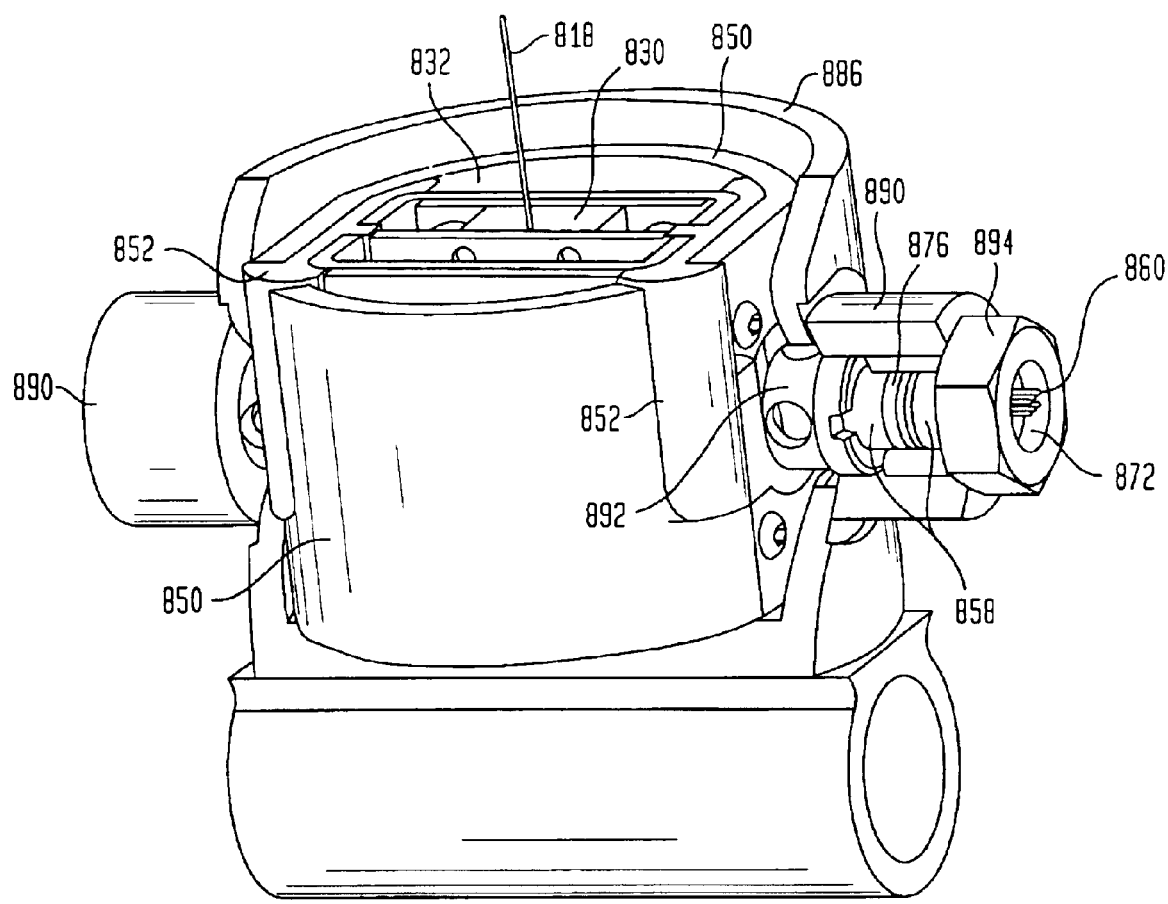
FIG. 15 shows the configuration of a wavelength-tunable stabilized laser according to a sixth embodiment of the invention.

Referring to FIG. 15, LDS 101-1 and 101-2 supply laser light to a coupler 102. The LDs 101 and the coupler 102 are formed on a base substrate 310-1 and constitute an LD array part. Being controlled in a manner described later, the LD array part supplies laser light having one of the eight wavelengths to a coupler 103.

The laser light is branched into three parts by the coupler 103. The first branched laser light is input to a coupler 123 via an ISO 121 and an SOA 122. The second branched laser light is input to a coupler 105-1 via an ET filter 104. The third branched laser light is input to a coupler 105-2.

As in the case of the second embodiment, outputs of the PDs 105-1 and 105-2 are represented by PDo1 and PDo2, respectively.

The coupler 103, the ET filter 104, and the PDs 105 constitute a wavelength detecting part.

The FSR of the ET filter 104 is determined in consideration of the spacing between the wavelengths at which the LD array part can oscillate. In particular, it is desirable that the FSR be set equal to the wavelength spacing. In this embodiment, since the LD array part can emit laser beams whose wavelengths are separated from each other by 0.8 nm, the FSR is set at 0.8 nm. It is also preferable that the FSR be set equal to ½, ¼, or the like of the spacing between the wavelengths at which the LD array part can oscillate.

Local maximums of the ET filter 104 are determined in consideration of locking points (target values, transmittance values) that are located on shoulders of the transmittance-wavelength characteristic. In particular, for the following reason, it is desirable that each locking point be located approximately at the center of a shoulder of the transmittance-wavelength characteristic. In this manner, the locking point is located at a wavelength approximately at the center of a locking range. Therefore, even when an LD 101 ignites at a wavelength shorter or longer than the wavelength of the locking point, the oscillation wavelength can be stabilized reliably.

The full width at half maximum of the ET filter 104 is determined in consideration of inclinations of parts of the transmittance-wavelength characteristic that are located on both sides of each locking point. When these inclinations are gentle, a variation in PDo1/PDo2 with respect to a variation in oscillation wavelength is small and hence the accuracy of stabilizing the oscillation wavelength at a desired wavelength becomes low. Conversely, when these inclinations are steep, a variation in PDo1/PDo2 with respect to a variation in oscillation wavelength is large and hence it is difficult to perform a feedback control for stabilizing the oscillation wavelength at a desired wavelength as exemplified by a long transient response time.

Returning to FIG. 15, to control the temperature of the LD array part, a temperature adjuster 301-1 and a temperature detector 304-1 are connected to a base substrate 310-1 so as to be in contact with it.

Since it is sufficient for the base substrate 310-1 to be able to control the temperature of the LDs 101, the coupler 102 may not be placed on the base substrate 310-1.

The temperature adjuster 301-1 is a Peltier device for changing the temperature of the base substrate 310-1. The temperature of the temperature adjuster 301-1 is controlled in such a manner that the CPU 108 changes the current value of a temperature adjuster driving circuit 302-1 via a D/A 303-1. The temperature adjuster driving circuit 302-1 supplies the controlled current to the temperature adjuster 301-1.

The temperature detector 304-1 is a thermistor for detecting the temperature of the base substrate 310-1. An output of the temperature detector 304-1 is input to the CPU 108 via an A/D 305-1.

Similarly, to control the temperature of the wavelength detecting part, temperature adjusters 301-2 and 304-2 are connected to a base substrate 310-2 so as to be in contact with it.

Since it is sufficient for the base substrate 310-2 to be able to control the temperature of the ET filter 104, the coupler 103 and the PDs 105 may not be placed on the base substrate 310-1.

The CPU 108 connected to the temperature adjuster 301-2 via a D/A 303-2 and a temperature adjuster driving circuit 302-2, controls the temperature of the temperature adjuster 301-2.

The temperature detector 304-2 detects the temperature of the base substrate 310-2, and an output of the temperature detector 304-2 is input to the CPU 108 via an A/D 305-2.

The CPU 108, which is also connected to the LDs 101 via a D/A 114 and an LD driving circuit 111, generates laser oscillation of the LDs 101.

On the other hand, the CPU 108 also connected to the SOA 122 via a D/A 126 and an SOA driving circuit 124, controls the gain of the SOA 122.

The first laser light input from the SOA 122 to the coupler 123 is branched into two parts by the coupler 123. One branched laser light is output as output light of the wavelength-tunable stabilized laser. The other branched laser light is input to a PD 125. The PD 125 detects the light intensity of the received laser light and an output of the PD 125 is input to the CPU 108 via an A/D 127.

The CPU 108 accesses a memory 309. The memory 309 stores a fifth program (described later) for controlling the wavelength-tunable stabilized laser, initial ignition driving current values of the respective LDs 101, an initial ignition driving current value of the SOA 122, initial ignition control values of each temperature adjuster 301 for the respective temperatures, target values of the respective locking points, a light intensity target value of laser light to be output from the wavelength-tunable stabilized laser, etc.

The initial ignition driving current values of the LDs 101 are set for the respective channels. Since only one locking point corresponding to each channel is located on one shoulder of the transmittance-wavelength characteristic, the initial ignition driving current values of the LDs 101 are so set that the LDs 101 oscillate in a wavelength range corresponding to the shoulder range of the transmittance-wavelength characteristic including the locking point.

The initial ignition driving current values of the temperature adjuster 301-2 are set correctly in consideration of the temperature dependence in the transmittance-wavelength characteristic of the ET filter 104 so that a locking point is located on a shoulder of a predetermined transmittance-wavelength characteristic at a temperature corresponding to each channel. It is preferable that the temperature of the wavelength detecting part be set 10° C.–15° C. higher than the temperature of the LD array part. In view of the facts that the LD array part is susceptible to heat radiation from the wavelength detecting part and other factors and that it includes semiconductor lasers, the above setting allows the CPU 108 to easily control the temperature of the LD array part.

The target values of the respective locking points corresponding to the respective channels can be equalized because the temperatures of the LD array part as a light source and the ET filter as a periodic filter are controlled independently.

(Principle of operation and advantages)

Next, the control of the wavelength-tunable stabilized laser for stabilizing the oscillation wavelength at a desired wavelength will be described.

The CPU 108 starts to execute the fifth program that is stored in the memory 309 upon application of power, for example.

Figure 16:
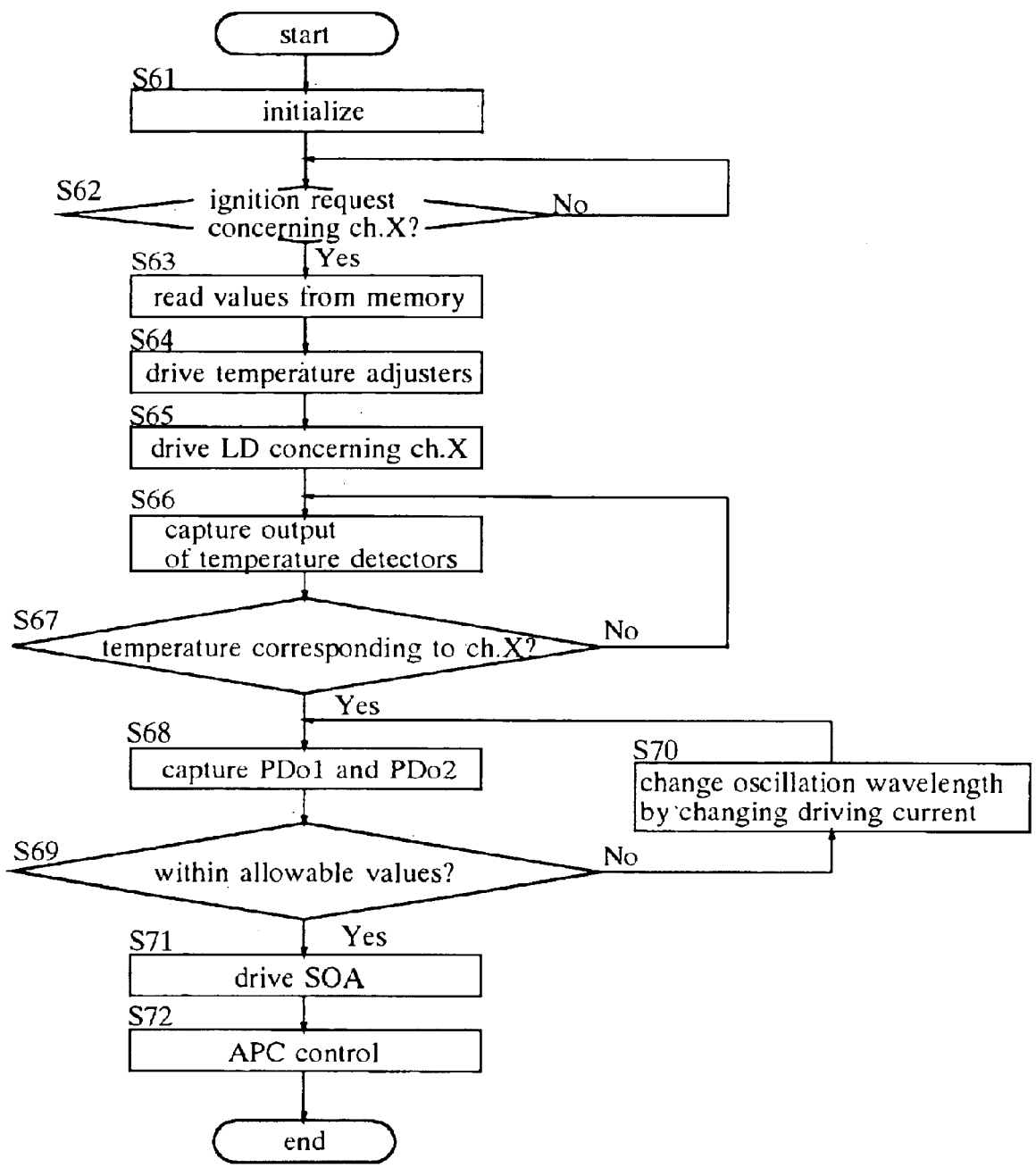
FIG. 16 is a flowchart showing an oscillation stabilizing control according to the sixth embodiment.

As shown in FIG. 16, at step S61, the CPU 108 initializes the individual circuits in the wavelength-tunable stabilized laser.

At step S62, the CPU 108 judges whether the wavelength-tunable stabilized laser has received a channel ignition request. When no channel ignition request has been received, step S62 is repeatedly executed until a channel ignition request is received.

Where the wavelength-tunable stabilized laser is used as a light source of a transmission station in a WDM optical communication system, for example, a channel ignition request is input to the CPU 108 from a controlling apparatus that supervises the transmission station.

When a channel ignition request has been received, at step S63 the CPU 108 accesses the memory 309 and reads from it an initial ignition driving current value of the LD 101-1 or 101-2 corresponding to chx, the initial ignition driving current value of the SOA 122, initial ignition control values of the respective temperature adjusters 301 to attain temperatures corresponding to chX, a target value of a locking point, and the light intensity target value of laser light to be emitted from the wavelength-tunable stabilized laser.

At step S64, the CPU 108 starts the temperature adjusters 301 by supplying the thus-read initial ignition control values of the temperature adjusters 301 to the temperature adjuster driving circuits 302 via the D/A's 303, respectively.

At step S65, the CPU 108 supplies the initial ignition driving current of the LD 101 corresponding to chX to the LD 101 via the D/A 114 and the LD driving circuit 111. Supplied with the driving current, the LD 101 starts to generate oscillation of laser light.

At step S66, the CPU 108 monitors the outputs of the temperature detectors 304 that is input via the A/D's 305. At step S67, the CPU 108 judges whether the differences between the detected temperatures and the temperatures corresponding to chX are smaller than predetermined allowable values.

When it is judged that one of the differences is not smaller than the allowable value, steps S66 and S67 are executed again. On the other hand, when it is judged that the differences are smaller than the allowable values, at step S68 the CPU 108 captures PDo1 and PDo2 and calculates PDo1/PDo2.

At step S69, the CPU 108 calculates the difference between the calculated PDo1/PDo2 value and the target value corresponding to chX by subtracting the former from the latter and judges whether the difference is smaller than a predetermined allowable value. The calculation of the difference between the calculated PDo1/PDo2 value and the target value corresponds to calculation of the difference between a current oscillation wavelength of the LD 101 and the chX wavelength.

When it is judged that the calculated difference is not smaller than the allowable value, at step S70 the CPU 108 changes the oscillation wavelength by changing the driving current of the LD 101 by means of the LD driving circuit 111. And the process returns to step S68.

The direction of changing the driving current of the LD 101 is determined in consideration of the shape of the shoulder of the transmittance-wavelength characteristic on which the locking point is located and whether the calculated difference is positive or negative.

On the other hand, when it is judged that the calculated difference is smaller than the allowable value, the CPU 108 judges that the oscillation wavelength has been stabilized (locked) at the chX wavelength. At step S71, the CPU 108 starts the SOA 122 by supplying the initial ignition driving current value of the SOA 122 to the SOA driving circuit 124 via the D/A 126.

At step S72, the CPU 108 controls the oscillation wavelength so that it is kept constant by monitoring the output of the PD 125 that is supplied via the A/D 127 and judges whether the difference between the output value of the PD 125 and the light intensity target value of laser light is smaller than a predetermined allowable value (APC control).

In this manner, in the wavelength-tunable stabilized laser, the wavelength of laser light is stabilized at the desired chX wavelength.

To make switching from chX to chY, the CPU 108 executes the above-described steps S63 to S72 again.

In the wavelength-tunable stabilized laser, since the temperatures of the LD 101 and the ET filter 104 are controlled independently in consideration of the temperature dependence of the oscillation wavelength of the LDs 101 and that of the transmittance-wavelength characteristic of the ET filter 104, the target values of the respective channels (respective oscillation wavelengths) can be equalized.

Therefore, the wavelength-tunable stabilized laser can emit light having a stabilized wavelength at all wavelengths at which oscillation is possible.

In the second to sixth embodiments, to simplify the description, the number of wavelengths at which oscillation is possible of the wavelength-tunable stabilized laser is assumed to be a specific number. However, the invention is not limited to such a case. The number of oscillation-possible wavelengths can be set arbitrarily.

Although in the second and third embodiments each locking point is located on a left shoulder of the transmittance-wavelength characteristic, it may be located on a right shoulder of the transmittance-wavelength characteristic. In this case, since the transmittance-wavelength characteristic of the ET filter shifts to the longer wavelength side as the device temperature increases, the first, second, third, and fourth target values are arranged in this order in the transmittance increasing direction. As for the device temperature changing direction, a positive difference obtained by subtracting the calculated PDo1/PDo2 value from the target value indicates that the oscillation wavelength is on the longer wavelength side of the locking point, the device temperature is changed so that the oscillation wavelength becomes shorter. Conversely, since a negative difference indicates that the oscillation wavelength is on the shorter wavelength side of the locking point, the device temperature is changed so that the oscillation wavelength becomes longer.

Although in the second to sixth embodiments the SOA is used as an optical amplifier, an optical fiber amplifier may be used instead. Where the output wavelength band of the wavelength-tunable stabilized laser is the 1,550 nm band, an erbium-doped fiber amplifier can be used. Erbium is one of the lanthanoid rare-earth elements and its symbol of element and atomic number are Er and 68, respectively. The lanthanoid elements have similar properties. Other known rare-earth elements that attain amplification in different wavelength bands include neodymium (Nd), praseodymium (Pr), and thulium (Tm). Optical fiber amplifiers include ones utilizing stimulated Raman scattering or stimulated Brillouin scattering.

Although in the second to sixth embodiments the SOA 122 is connected to the output side of the ISO 121, the invention is not limited to such a case. The SOA 122 may be disposed at any position where it can amplify laser light that will finally become an output of the wavelength-tunable stabilized laser. For example, the SOA 122 may be disposed between the coupler 102 and the coupler 103 (or 151), in which case the SOA 122 amplifies laser light that is output from the coupler 102 and supplies the amplified laser light to the coupler 103 (or 151). This arrangement allows the SOA 122 to be formed integrally with the LDS 101. As an another example, the SOA 122 may be disposed between the couple 103 (or 151) and the ISO 121, in which case the SOA 122 amplifies laser light that is output from the coupler 103 (or 151) and supplies the amplified laser light to the ISO 121.

Next, wavelength-tunable stabilized laser modules will be described with reference to FIGS. 17 to 20A–20B. FIG. 20A is a top view of a module and FIG. 20B is a sectional view taken along line A–A' in FIG. 20A.

The modules of first to fourth examples can be used in the first to sixth embodiments. In particular, the module of the fourth example is suitable for use in the sixth embodiment. The modules of the first to third examples are such that the SOA and the LDs are formed integrally with each other. The module of the second example is such that the SOA is disposed on the input side of the SOA. The module of the third example is such that the LD array part including an LD array chip etc. and the wavelength detecting part including the ET filter etc. are provided on separate base substrates and their temperatures are controlled independently. Each of the modules of the first to fourth examples is provided with eight LDS and is able to oscillate at 32 wavelengths.

Figure 17:
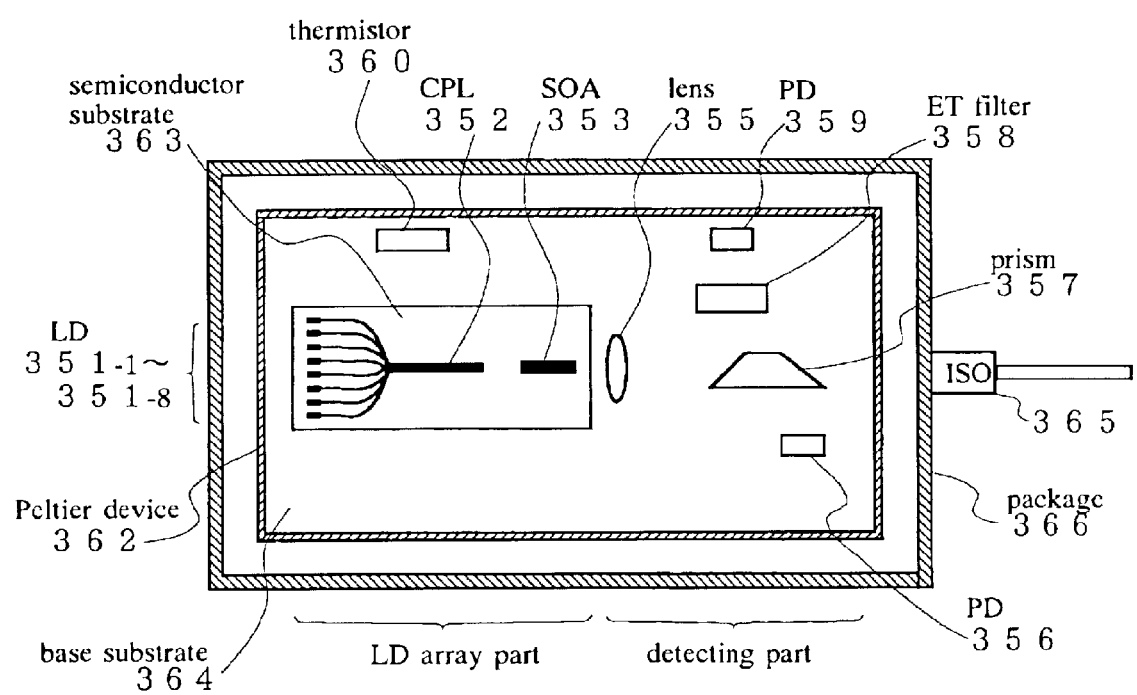

As shown in FIG. 17, the module of the first example is composed of LDs 351, a coupler 352, an SOA 353, a condenser lens 355, PDs 356 and 359, a prism 357, an ET filter 358, a thermistor 360, a Peltier device 362, a semiconductor substrate 363, a base substrate 364, an ISO 365, and a package 366.

The LDs 351, the coupler 352, the SOA 353 are formed on the same semiconductor substrate 363 in an integral manner and constitute an LD array part. The LD array part, the lens 355, the PDs 356 and 359, the prism 357, the ET filter 358, and the thermistor 360 are placed on the base substrate 364 and the base substrate 364 is placed on the Peltier device 362. The above devices are accommodated in the package 366.

For example, the correspondence between the components of the second embodiment and those of this first example is as follows. The LDS 101 correspond to the LDS 351, the coupler 102 corresponds to the coupler 352, and the coupler 103 corresponds to the prism 357. The ET filter 104 corresponds to the ET filter 358, the PDs 105-1 and 105-2 correspond to the PDs 359 and 356, respectively, the SOA 122 corresponds to the SOA 353, and the ISO 121 corresponds to the ISO 362. The temperature adjuster 106 corresponds to the Peltier device 362 and the temperature detector 107 corresponds to the thermistor 360.

Figure 18:
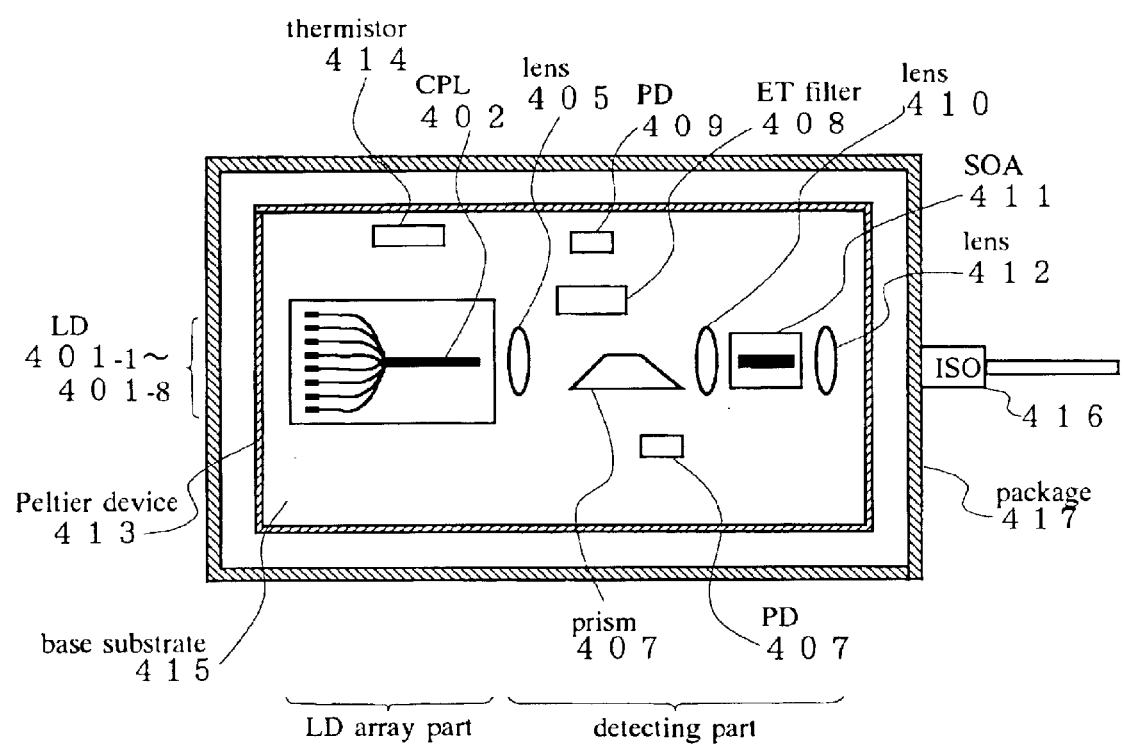

As shown in FIG. 18, the module of the second example is composed of LDs 401, a coupler 402, condenser lenses 405, 410, and 412, PDs 407 and 409, a prism 407, an ET filter 408, a thermistor 414, a Peltier device 413, an SOA 411, a base substrate 415, an ISO 416, and a package 417.

The LDs 401 and the coupler 402 are formed on the same semiconductor substrate 363 in an integral manner and constitute an LD array part. The LD array part, the lenses 405, 410, and 412, the PDs 407 and 419, the prism 406, the ET filter 408, the thermistor 414, and the SOA 411 are placed on the base substrate 415 and the base substrate 415 is placed on the Peltier device 413. The Peltier device 413 adjusts the temperature of the LD array part and the wavelength detecting part. The wavelength detecting part is composed of the lenses 405, 410, and 412, the PDs 407 and 409, the prism 406, the ET filter 408, the thermistor 414, and the SOA 411. The above devices are accommodated in the package 417.

For example, the correspondence between the components of the second embodiment and those of this second example is as follows. The LDs 101 correspond to the LDs 401, the coupler 102 corresponds to the coupler 402, and the coupler 103 corresponds to the prism 406. The ET filter 104 corresponds to the ET filter 408, the PDS 105-1 and 105-2 correspond to the PDs 409 and 407, respectively, the SOA 122 corresponds to the SOA 411, and the ISO 121 corresponds to the ISO 416. The temperature adjuster 106 corresponds to the Peltier device 413 and the temperature detector 107 corresponds to the thermistor 414.

Figure 19:
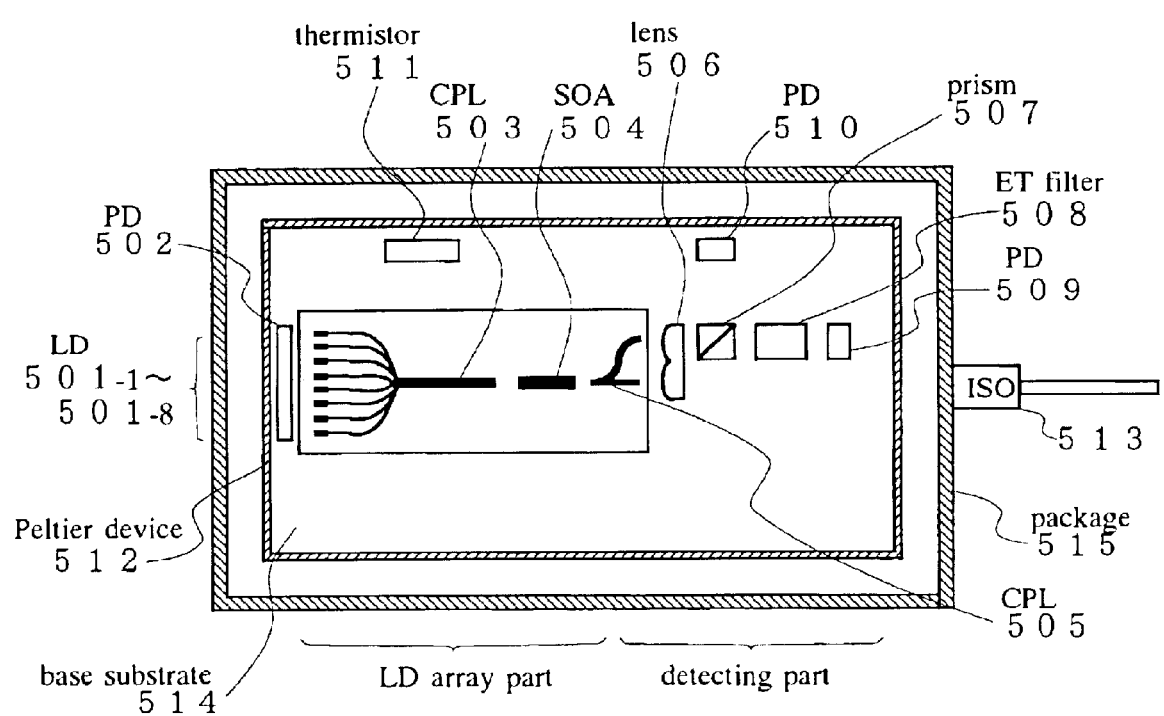
Figure 20:
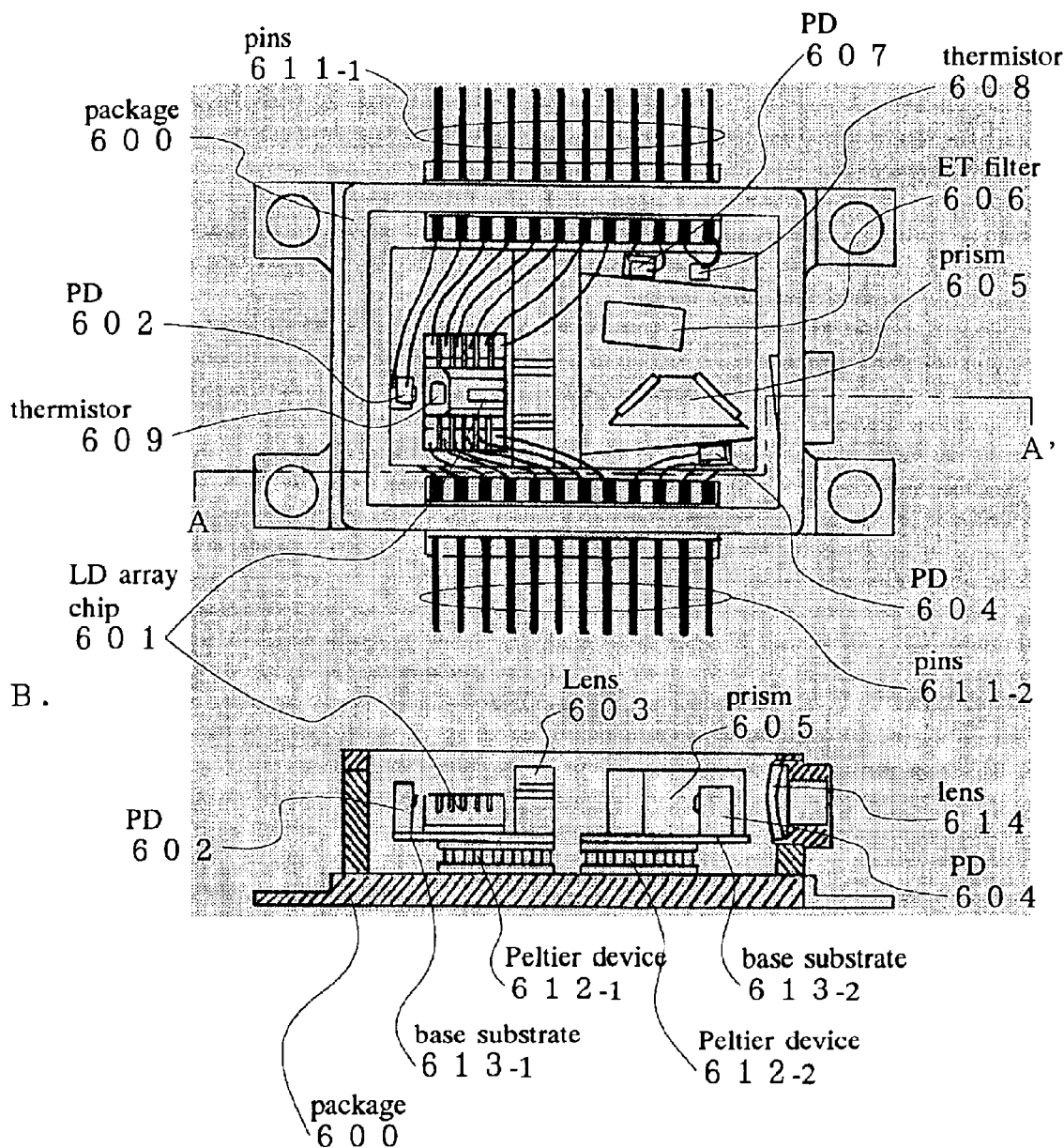
Figure 22:
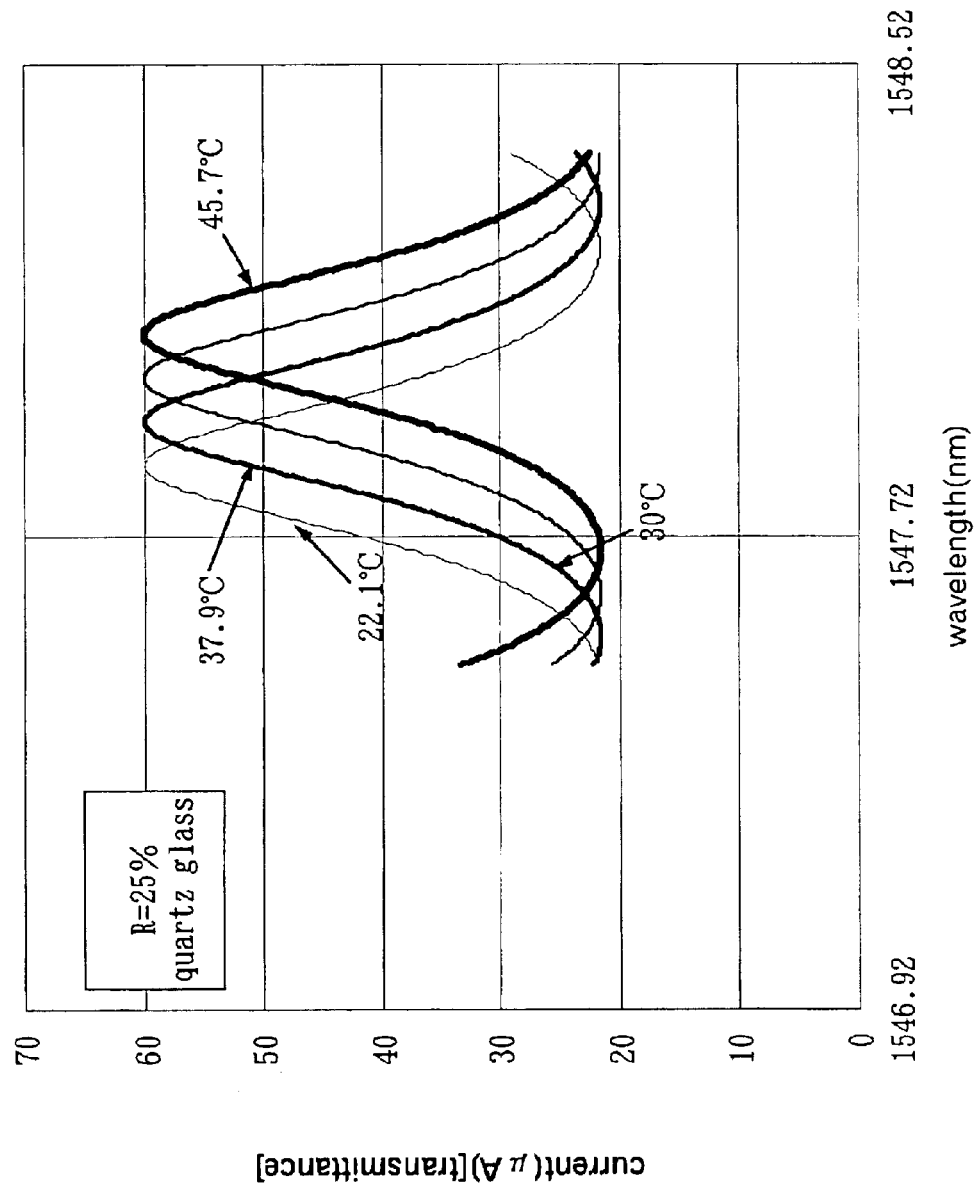
FIG. 22 shows temperature dependence in a transmittance-wavelength characteristic of a Fabry-Pérot etalon filter.

As shown in FIG. 19, the module of the third example is composed of LDs 501, couplers 503 and 504, an SOA 504, a condenser lens 506, PDS 509 and 510, a prism 507, an ET filter 508, a thermistor 511, a Peltier device 512, an ISO 513, a base substrate 514, and a package 515.

The LDs 501, the couplers 503 and 505, and the SOA 504 are formed on the same semiconductor substrate in an integral manner and constitute an LD array part. The LD array part, the PD 502, the lens 506, the PDs 510 and 509, the prism 507, the ET filter 508, the thermistor 511 are placed on the base substrate 514 and the base substrate 514 is placed on the Peltier device 512. The Peltier device 413 adjusts the temperature of the LD array part and the wavelength detecting part. The above devices are accommodated in the package 515.

For example, the correspondence between the components of the second embodiment and those of this third example is as follows. The LDS 101 correspond to the LDs 501, the coupler 102 corresponds to the coupler 503, and the coupler 103 corresponds to the coupler 505 and the prism 406. The ET filter 104 corresponds to the ET filter 508, the PDs 105-1 and 105-2 correspond to the PDs 509 and 510, respectively, the SOA 122 corresponds to the SOA 504, and the ISO 121 corresponds to the ISO 513. The temperature adjuster 106 corresponds to the Peltier device 512 and the temperature detector 107 corresponds to the thermistor 511.

As shown in FIGS. 20A and 20B, the module of the fourth example is composed of an LD array chip 601, condenser lenses 603 and 614, PDs 602, 604, and 607, a prism 605, an ET filter 606, thermistors 608 and 609, Peltier devices 612, base substrates 613, and a package 600.

The LD array chip 601 is provided with eight LDs, a coupler for combining laser beams that are output from the LDS, and an SOA for amplifying output light of the coupler. The LDs, the coupler, and the SOA are formed on the same semiconductor substrate in an integral manner. The PD 602 detects the back power of back laser light that is output from the LD array chip 601. The LD array chip 601, the PD 602, the thermistor 609, and the lens 603 are placed on the base substrate 613-1, which is placed on the Peltier device 612-1.

The PDs 604 and 607, the prism 605, the ET filter 606, and the thermistor 608 are placed on the base substrate 613-2, which is placed on the Peltier device 612-2. The Peltier devices 612 are accommodated in the package 600.

The electrode pads of the LD array chip 601, the PDs 602, 604, and 607, the thermistors 608 and 609, and the Peltier devices 612 are connected, by wire bonding, to respective connection pins 611 the package 600 that are provided for electrical connection between the inside components and the outside apparatus.

For example, the correspondence between the components of the second embodiment and those of this fourth example is as follows. The LDs 101 and the coupler 102 correspond to the LD array chip 601, the coupler 103 corresponds to the prism 605. The ET filter 104 corresponds to the ET filter 606, the PDs 105-1 and 105-2 correspond to the PDs 607 and 604, respectively. The temperature adjuster 106 corresponds to the Peltier devices 612 and the temperature detector 107 corresponds to the thermistors 608 and 609.

The invention is not limited to the above embodiments and various modifications may be made without departing from the spirit and the scope of the invention. Any improvement may be made in part or all of the components.

What is claimed is:

1. A device comprising:
a light source having a plurality of lasers to oscillate at a plurality of wavelengths;
an etalon filter having a periodic transmittance-wavelength characteristic for receiving laser light output from said light source;
light detecting means for receiving laser light output from said etalon filter and detecting light intensity of the received laser light; and
controlling means for generating oscillation of any one of said plurality of lasers at a desired wavelength, and for controlling an oscillation wavelength of the laser so that an output value of said light detecting means becomes equal to a target value corresponding to said desired wavelength among a plurality of target values respectively set for each of said plurality of wavelengths.

2. A device according to claim 1, wherein, laser light output from said light source has nearly constant wavelength spacing,
a length of a period of said etalon filter is substantially equal to a length of said wavelength spacing, and
each of said plurality of target values is set at a value between two adjacent extremums of said transmittance-wavelength characteristic.

3. A device according to claim 2, wherein a target value corresponding to a center wavelength of said plurality of wavelengths is set at a value at approximately the center of two adjacent extremums of said transmittance-wavelength characteristic.

4. A device according to claim 2, wherein said controlling means controls said oscillation wavelength after generating oscillation of said one laser at a wavelength which is in a range including a wavelength approximately at the center of two adjacent extremums of said transmittance-wavelength characteristic, the range included in ranges between said desired wavelength and a wavelength closest to said desired wavelength and having an extremum of said transmittance-wavelength characteristic.

5. A device according to claim 2, wherein said controlling means controls said oscillation wavelength after generating oscillation of said one laser at a wavelength which is closest to said desired wavelength and is approximately at the center of two adjacent extremums of said transmittance-wavelength characteristic.

6. A device according to claim 2, further comprising:
optical amplifying means for amplifying laser light to be output to an exterior.

7. A device according to claim 6, wherein said optical amplifying means is used in a saturation range.

8. A device according to claim 2, wherein said plurality of lasers are semiconductor lasers, and
said controlling means controls said oscillation wavelength by controlling device temperature of said one laser.

9. A device according to claim 2, wherein said plurality of lasers are semiconductor lasers, and
said controlling means controls said oscillation wavelength by controlling driving current of said one laser.

10. A device according to claim 2, wherein said plurality of lasers are semiconductor lasers, and
said controlling means controls device temperature of said one laser when generating oscillation of said one laser and controls driving current of said one laser when controlling said oscillation wavelength.

11. A device according to claim 1, further comprising:
a plurality of etalon filters whose transmittance-wavelength characteristics are the same in period and temperature dependence; and
a plurality of light detecting means corresponding with the said plurality of etalon filters, respectively, to receive laser light output from the filters.

12. A device according to claim 11, wherein laser light output from said light source has nearly constant wavelength spacing,
each of said spacing is divided into a plurality of wavelength ranges, and
each of said wavelength ranges is respectively within ranges between two adjacent extremums of said transmittance-wavelength characteristics of said plurality of filters.

13. A device according to claim 1, wherein said etalon filter has temperature dependence, which is said transmittance-wavelength characteristic, in accordance with temperature dependence of an oscillation wavelength of said plurality of lasers.

14. A device comprising:
a laser to oscillate at a plurality of wavelengths;
an etalon filter for receiving laser light output from said laser, which transmittance-wavelength characteristic is temperature dependence in accordance with temperature dependence of an oscillation wavelength of said laser;
light detecting means for receiving laser light output from said etalon filter and detecting light intensity of the received laser light; and
controlling means for generating oscillation of said laser at one of said plurality of wavelengths, and controlling an oscillation wavelength of laser light output from said laser so that an output value of said light detecting means becomes equal to a target value that is set for each of said plurality of wavelengths.

15. An apparatus, comprising:
a light source having a plurality of lasers to oscillate at a plurality of wavelengths;
an etalon filter having a periodic transmittance-wavelength characteristic to receive laser light output from said light source;
a light detecting unit to receive laser light output from said etalon filter, and to detect light intensity of the received laser light; and
a control unit to generate oscillation of any one of said plurality of lasers at a desired wavelength, and to control the oscillation wavelength of the laser so that an output value of said light detecting unit becomes equal to a target value corresponding to said desired wavelength among a plurality of target values respectively set for each of said plurality of wavelengths.

16. An apparatus, comprising:
a light source having a plurality of lasers to oscillate at a plurality of wavelengths;
etalon filters, each having a periodic transmittance-wavelength characteristic to receive laser light output from said light source;
light detecting units to correspond to said etalon filters, respectively, to receive laser light output from said etalon filters, and to detect light intensity of the received laser light; and
a control unit to generate oscillation of any one of said plurality of lasers at a desired wavelength, and to control the oscillation wavelength of the respective laser of said plurality of lasers so that an output value of the respective light detecting unit becomes equal to a target value corresponding to said desired wavelength among a plurality of target values respectively set for each of said plurality of wavelengths.

17. An apparatus, comprising:
a light source having a plurality of lasers to oscillate at a plurality of wavelengths; a light detecting unit to receive laser light output from an etalon filter, and to detect light intensity of the received laser light; and
a control unit to generate oscillation of one of said lasers at a desired wavelength, and to control the oscillation wavelength of the laser so that an output value of said light detecting unit becomes equal to a target value corresponding to said desired wavelength.

18. A method comprising:

oscillating a plurality of wavelengths output from a plurality of lasers of a light source;

receiving laser light output from said light source with an etalon filter having a periodic transmittance-wavelength characteristic;

receiving laser light output from said etalon filter and detecting light intensity of the received laser light; and generating oscillation of one of said plurality of lasers at a desired wavelength, and controlling the oscillation wavelength of the laser so that an output value of said detecting becomes equal to a target value corresponding to said desired wavelength among a plurality of target values respectively set for each of said plurality of wavelengths.

* * * * *